(12) United States Patent
Lee et al.

(10) Patent No.: US 11,871,568 B2
(45) Date of Patent: Jan. 9, 2024

(54) SEMICONDUCTOR DEVICE

(71) Applicant: SK hynix Inc., Icheon-si (KR)

(72) Inventors: Jin Won Lee, Seoul (KR); Nam Jae Lee, Cheongju-si (KR)

(73) Assignee: SK hynix Inc., Icheon-si (KR)

(\*) Notice: Subject to any disclaimer, the term of this patent is extended or adjusted under 35 U.S.C. 154(b) by 0 days.

(21) Appl. No.: 17/395,093

(22) Filed: Aug. 5, 2021

(65) Prior Publication Data

US 2021/0366929 A1     Nov. 25, 2021

Related U.S. Application Data

(63) Continuation of application No. 16/299,252, filed on Mar. 12, 2019, now Pat. No. 11,114,454.

(30) Foreign Application Priority Data

Jul. 25, 2018    (KR) ........................ 10-2018-0086842

(51) Int. Cl.
| | |
|---|---|
| *H01L 27/11582* | (2017.01) |
| *H01L 27/11524* | (2017.01) |
| *H10B 43/27* | (2023.01) |
| *H01L 21/768* | (2006.01) |
| *H01L 23/535* | (2006.01) |
| *H10B 41/27* | (2023.01) |
| *H10B 41/35* | (2023.01) |
| *H10B 41/41* | (2023.01) |

(Continued)

(52) U.S. Cl.
CPC ....... *H10B 43/27* (2023.02); *H01L 21/76805* (2013.01); *H01L 21/76895* (2013.01); *H01L 23/535* (2013.01); *H10B 41/27* (2023.02); *H10B 41/35* (2023.02); *H10B 41/41* (2023.02); *H10B 43/35* (2023.02); *H10B 43/40* (2023.02)

(58) Field of Classification Search
CPC ......... H01L 27/11582; H01L 21/76805; H01L 21/76895; H01L 23/535; H01L 27/11524; H01L 27/11529; H01L 27/11556; H01L 27/1157; H01L 27/11573; H01L 27/11565; H01L 27/11519; H01L 27/11563; H01L 27/11568; H01L 27/11578; H01L 27/11551; H01L 21/76897; H01L 29/788; H10B 43/27; H10B 41/27; H10B 41/35; H10B 41/41; H10B 43/35; H10B 43/40; H10B 43/10; H10B 41/10; H10B 43/00; H10B 43/20; H10B 43/30; H10B 41/20
See application file for complete search history.

(56) References Cited

U.S. PATENT DOCUMENTS

| | | | |
|---|---|---|---|
| 9,818,693 | B2 | 11/2017 | Toyama et al. |
| 2004/0076068 | A1 | 4/2004 | Yamada et al. |

(Continued)

FOREIGN PATENT DOCUMENTS

| | | |
|---|---|---|
| CN | 1476072 A | 2/2004 |
| CN | 106449595 A | 2/2017 |

(Continued)

*Primary Examiner* — Cuong B Nguyen
(74) *Attorney, Agent, or Firm* — William Park & Associates Ltd.

(57) ABSTRACT

A semiconductor device includes a source structure penetrated by a first penetrating portion, a first stack structure disposed on the source structure and penetrated by a second penetrating portion overlapping the first penetrating portion.

14 Claims, 18 Drawing Sheets

(51) Int. Cl.
 *H10B 43/35* (2023.01)
 *H10B 43/40* (2023.01)

(56) References Cited

U.S. PATENT DOCUMENTS

| | | | |
|---|---|---|---|
| 2008/0017889 | A1 | 1/2008 | Koh et al. |
| 2015/0287739 | A1 | 10/2015 | Lee |
| 2016/0148948 | A1 | 5/2016 | Kim |
| 2017/0148810 | A1* | 5/2017 | Kai ...................... H01L 23/535 |
| 2017/0162591 | A1 | 6/2017 | Choi |
| 2017/0207226 | A1 | 7/2017 | Lee |
| 2017/0271361 | A1* | 9/2017 | Sonehara ............... H10B 43/27 |
| 2018/0122822 | A1 | 5/2018 | Lee et al. |
| 2018/0261529 | A1* | 9/2018 | Yoshimizu ........ H01L 27/11556 |

FOREIGN PATENT DOCUMENTS

| | | |
|---|---|---|
| CN | 106856197 A | 6/2017 |
| JP | H05175243 A | 7/1993 |
| JP | 2018107230 A | 7/2018 |
| KR | 101147526 B1 | 5/2012 |
| KR | 1020170065290 A | 6/2017 |
| KR | 1020170067506 A | 6/2017 |

* cited by examiner

SEMICONDUCTOR DEVICE

CROSS-REFERENCE TO RELATED APPLICATION

The present application is a continuation application of U.S. application Ser. No. 16/299,252, filed on Mar. 12, 2019, and claims priority under 35 U.S.C. § 119(a) to Korean patent application number 10-2018-0086842, filed on Jul. 25, 2018, the entire disclosure of which is incorporated herein by reference in its entirety.

BACKGROUND

1. Technical Field

Various embodiments of the present disclosure relate to a semiconductor device and a method of manufacturing the same, and more particularly, to a three-dimensional semiconductor device and a method of manufacturing the same.

2. Related Art

A semiconductor device may include a memory device capable of storing data. A three-dimensional semiconductor device has been proposed to improve the integration density of the memory cells.

The three-dimensional semiconductor device may include memory cells arranged in three dimensions. The memory cells arranged in three dimensions may be defined at intersections between conductive patterns stacked to be spaced apart from each other on a substrate and channel pillars passing through the conductive patterns.

Various technologies have been developed to simplify a manufacturing process of the above-described three-dimensional semiconductor device.

SUMMARY

According to an embodiment, a semiconductor device may include a source structure penetrated by a first penetrating portion, a first stack structure disposed on the source structure and penetrated by a second penetrating portion overlapping the first penetrating portion, a second stack structure disposed on the first stack structure and extending to overlap the first penetrating portion and the second penetrating portion, and channel pillars passing through the second stack structure and the first stack structure.

According to an embodiment, a semiconductor device may include a source structure penetrated by a first penetrating portion, a first stack structure disposed on the source structure and divided into memory blocks by first slits, and a second penetrating portion passing through the first stack structure of each of the memory blocks and overlapping the first penetrating portion. The source structure may include a protruding portion protruding further towards a center region of the second penetrating portion than an edge of the first stack structure defined by the second penetrating portion in a horizontal direction.

According to an embodiment, a method of manufacturing a semiconductor device may include forming a first stack structure by alternately stacking first and second material layers on a source stack structure, forming a first penetrating portion passing through the first stack structure and the source stack structure, and forming a second penetrating portion exposing a top surface of the source stack structure by etching the first stack structure from a side portion of the first penetrating portion.

According to an embodiment, a semiconductor device may include a source structure including an etch stop layer and penetrated by a first penetrating portion, and a first stack structure disposed on the source structure and penetrated by a second penetrating portion overlapping the first penetrating portion. The second penetrating portion may be wider than the first penetrating portion.

DETAILED DESCRIPTION

The technical spirit of the present disclosure may include examples of embodiments to which various modifications and changes may be applied and which include various forms. Hereinafter, examples of embodiments of the present disclosure will be described in order for those skilled in the art to which the present disclosure pertains to be able to readily implement the technical spirit of the present disclosure.

While terms such as "first" and "second" may be used to describe various components, such components must not be understood as being limited to the above terms. The above terminologies are used to distinguish one component from the other component, for example, a first component may be referred to as a second component without departing from a scope in accordance with the concept of the present disclosure and similarly, a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms as well, unless the context clearly indicates otherwise. In the present specification, it should be understood that terms "include" or "have" indicate that a feature, a number, a step, an operation, a component, a part or the combination those of described in the specification is present, but do not exclude a possibility of presence or addition of one or more other features, numbers, steps, operations, components, parts or combinations thereof, in advance.

Embodiments of the present disclosure provide a semiconductor device capable of simplifying a manufacturing process of a three-dimensional semiconductor device, and a method of manufacturing the same.

Figure 1:
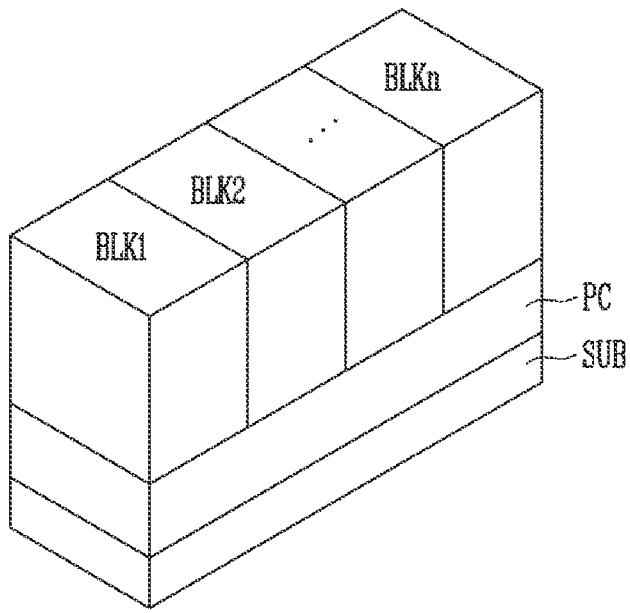
FIG. 1 is a block diagram schematically illustrating a semiconductor device according to an embodiment.

FIG. 1 is a block diagram schematically illustrating a semiconductor device according to an embodiment.

Referring to FIG. 1, a semiconductor device according to various embodiments may include a peripheral circuit structure PC and memory blocks BLK1 to BLKn disposed on a substrate SUB. The memory blocks BLK1 to BLKn may overlap the peripheral circuit structure PC.

The substrate SUB may be a single crystal semiconductor layer. For example, the substrate SUB may be a bulk silicon substrate, a silicon-on-insulator substrate, a germanium substrate, a germanium-on-insulator substrate, a silicon-germanium substrate, or an epitaxial thin film formed by a selective epitaxial growth method, etc.

The peripheral circuit structure PC may include a row decoder, a column decoder, a page buffer, and a control circuit. The peripheral circuit structure PC may include NMOS and PMOS transistors, a resistor, and a capacitor which are electrically coupled to the memory blocks BLK1 to BLKn. The peripheral circuit structure PC may be disposed between the substrate SUB and the memory blocks BLK1 to BLKn.

Each of the memory blocks BLK1 to BLKn may include impurity doping regions, bit lines, cell strings electrically coupled to the impurity doping regions and the bit lines, word lines electrically coupled to the cell strings, and select lines electrically coupled to the cell strings. Each of the cell strings may include memory cells and select transistors coupled in series by a channel layer. Each of the select lines may serve as a gate electrode of a corresponding select transistor and each of the word lines may serve as a gate electrode of a corresponding memory cell.

When the peripheral circuit structure PC is arranged between the substrate SUB and the memory blocks BLK1 to BLKn as described above, a peripheral contact plug coupled to the peripheral circuit structure PC and extending to a level where the memory blocks BLK1 to BLKn are disposed may be disposed in a cell array region where the memory blocks BLK1 to BLKn are disposed.

Figure 2A:
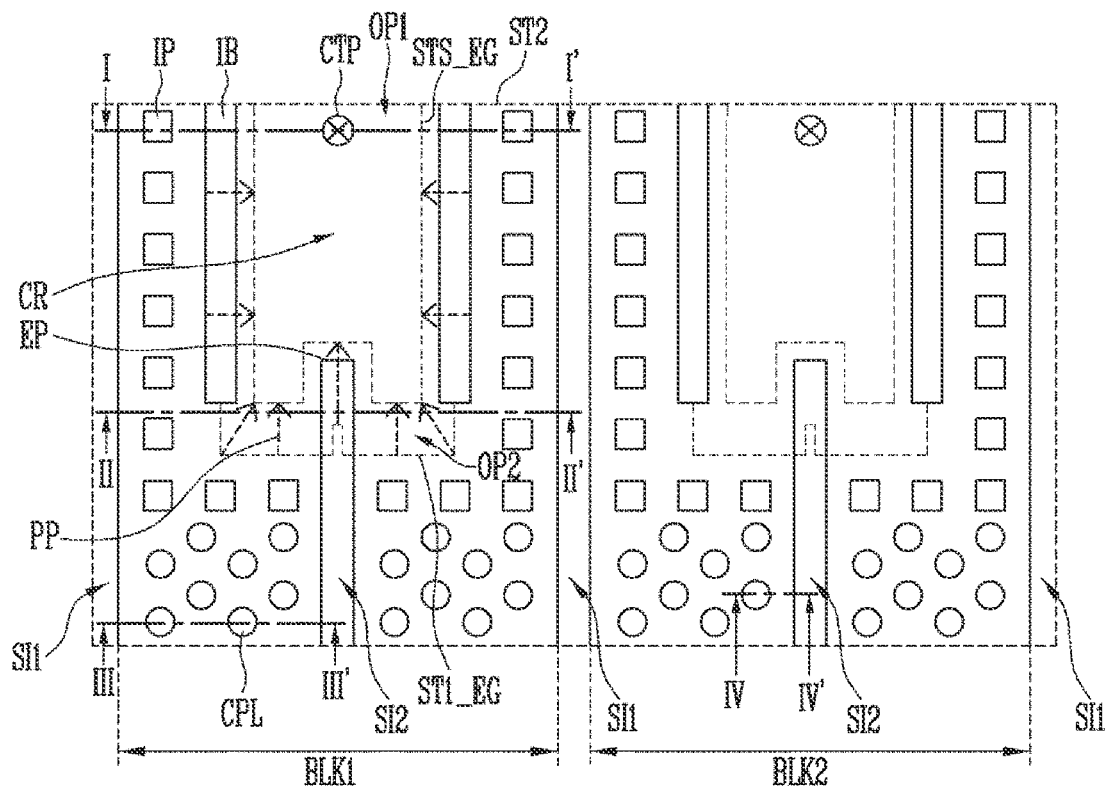
FIGS. 2A and 2B are diagrams illustrating a structure of a memory block according to an embodiment.
Figure 2B:
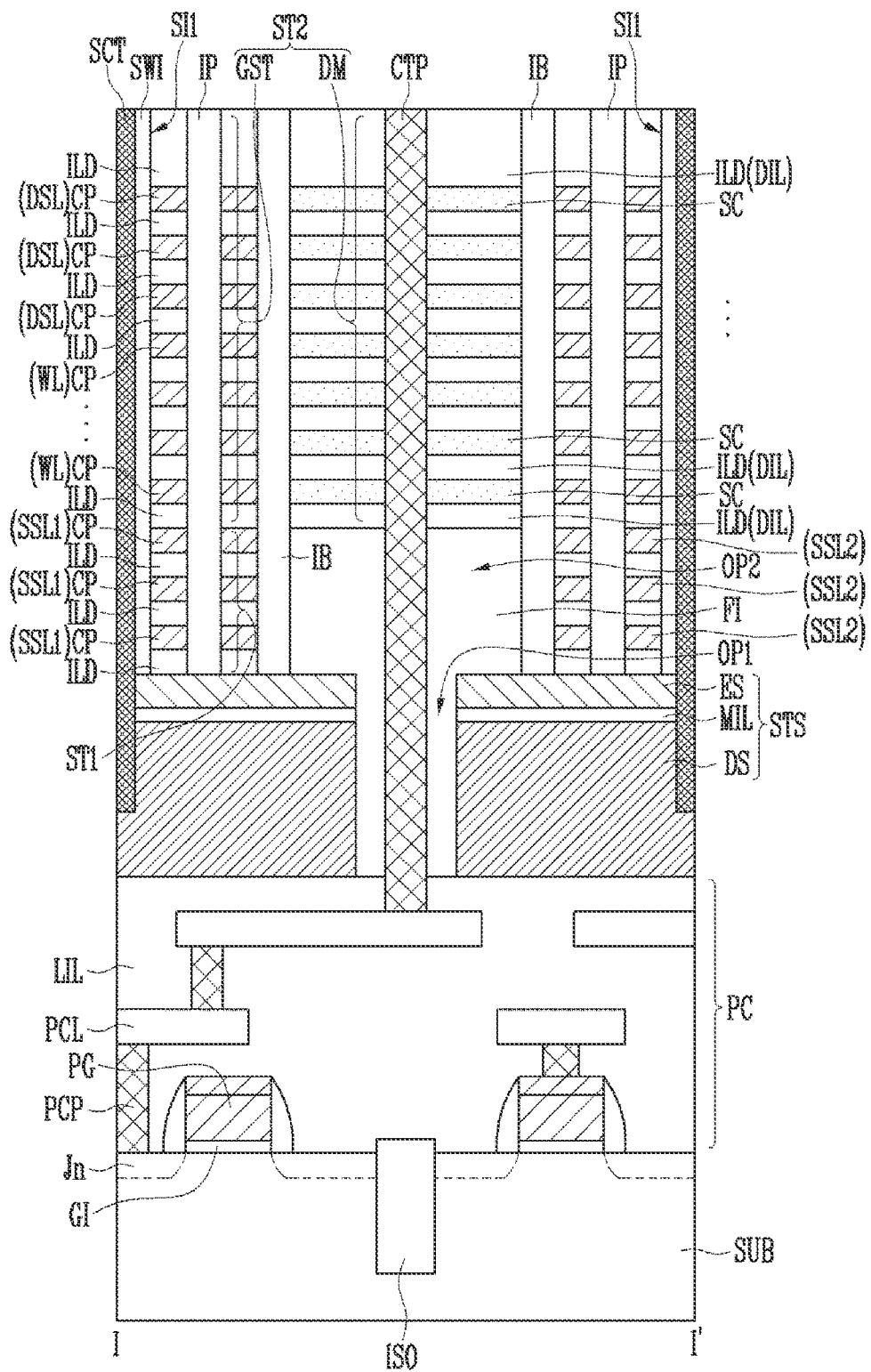

FIGS. 2A and 2B are diagrams illustrating a structure of a memory block according to various embodiments. For example, FIG. 2A illustrates a layout of a first memory block and a second memory block neighboring each other and FIG. 2B is a cross section taken along line I-I' of FIG. 2A.

Referring to FIG. 2A, each of the memory blocks BLK1 and BLK2 may include a first stack structure ST1 shown in FIG. 2B and a second stack structure ST2 stacked on a source structure STS shown in FIG. 2B. Each of the first stack structure ST1 and the second stack structure ST2 may be divided into the memory blocks BLK1 and BLK2 by first slits SI1.

Each of the memory blocks BLK1 and BLK2 may be penetrated by channel pillars CPL, a second slit SI2, a first penetrating portion OP1 and a second penetrating portion OP2. The first penetrating portion OP1 may be overlapped by the second stack structure ST2 and pass through the source structure STS shown in FIG. 2B disposed under the second stack structure ST2. The second penetrating portion OP2 may be overlapped by the second stack structure ST2 and pass through the first stack structure ST1 shown in FIG. 2B disposed between the source structure STS shown in FIG. 2B and the second stack structure ST2. In other words, the second penetrating portion OP2 may pass through the first stack structure ST1 of each of the memory blocks BLK1 and BLK2 as shown in FIG. 2B.

Referring to FIG. 2A, the second penetrating portion OP2 may overlap with the first penetrating portion OP1. The second penetrating portion OP2 may be wider than the first penetrating portion OP1. For example, the second penetrating portion OP2 may be divided into a center region overlapping the first penetrating portion OP1 and an edge region extending from the center region in a horizontal direction and not overlapping the first penetrating portion OP1. The edge region of the second penetrating portion OP2 may be overlapped with the source structure STS shown in FIG. 2B. According to the above-described structure, an edge of the source structure STS_EG which is defined by the first penetrating portion OP1 may protrude further towards the center CR of the second penetrating portion OP2 than an edge of the first stack structure ST1_EG which is defined by the second penetrating portion OP2 in the horizontal direction indicated by the dotted arrow.

The second slit SI2 may be disposed between the first slits SI1 neighboring each other. The second slit SI2 may traverse a space between the channel pillars CPL passing through each of the memory blocks BLK1 and BLK2 to pass through a portion of the first stack structure overlapped by the second stack structure ST2 and the second stack structure ST2. The second slit SI2 may cross one side of the second penetrating portion OP2. Thereby, the second slit SI2 and the second penetrating portion OP2 may be coupled. The first stack structure of each of the memory blocks BLK1 and BLK2 may be separated from sub-stack structures by a connection structure of the second slit SI2 and the second penetrating portion OP2.

An end portion EP of the second slit SI2 which faces the first penetrating portion OP1 might not be coupled to the first penetrating portion OP1 but may be spaced apart from the first penetrating portion OP1. Thereby, the second slit SI2 might not overlap the first penetrating portion OP1 and the source structure STS may extend between the second slit SI2 and the first penetrating portion OP1 in a plan view. The end portion EP of the second slit SI2 which faces the first penetrating portion OP1 may be aligned on a protruding portion of the source structure PP. The protruding portion of the source structure PP may protrude further towards the center CR of the second penetrating portion OP2 than the edge of the first stack structure ST1_EG in the horizontal direction, that indicated by the dotted arrow. According to the above-described layout of the second slit SI2, patterns disposed under the protruding portion of the source structure PP may be protected by the protruding portion of the source structure PP when the second slit SI2 is formed. In other words, the protruding portion of the source structure PP may serve as an etch stop layer when the second slit SI2 is formed.

The second stack structure ST2 disposed at a region where the second penetrating portion OP2 and the first penetrating portion OP1 are overlapped may be penetrated by a peripheral contact plug CTP. The peripheral contact plug CTP may pass through the second stack structure ST2 to extend into the second penetrating portion OP2 and the first penetrating portion OP1. A process for forming the peripheral contact plug CTP may be simplified and stably performed by disposing the peripheral contact plug CTP at the region where the first penetrating portion OP1 and the second penetrating portion OP2 are located.

The channel pillars CPL may be disposed between each of the first slits SI1 and the second slit SI2 adjacent thereto. The channel pillars CPL may pass through the second stack structure ST2 and the portion of the first stack structure overlapped by the second stack structure ST2. The channel pillars CPL may extend into a portion the source structure overlapped by the second stack structure ST2.

To improve stability of a manufacturing process of the semiconductor device, supporting structures may be further formed around the second penetrating portion OP2. The supporting structures may have various structures. For example, the supporting structures may include at least one of insulating pillars, insulating bars, and dummy channel pillars. FIG. 2A illustrates supporting structures including insulating pillars IP and Insulating bars IB.

The insulating pillars IP and the insulating bars IB may be disposed to be adjacent to the second penetrating portion OP2 and extend to pass through the portion of the first stack structure overlapped by the second stack structure ST2 and the second stack structure ST2. Each of the insulating bars IB may overlap a side portion of the second penetrating portion OP2 which faces the first slit SI1. The insulating pillars IP may be disposed between each of the insulating bars IB and the first slit SI1 and between the second penetrating portion OP2 and the channel pillars CPL. Each of the insulating bars IB may have a greater length than each of the insulating pillars IP in the horizontal direction. The insulating pillars IP and the insulating bars IB disposed between each of the first slits SI1 and the second penetrating portion OP2 may prevent an etching material from flowing in towards the region where the peripheral contact plug CTP are disposed during a manufacturing process of a semiconductor device.

Referring to FIG. 2B, the peripheral circuit structure PC described with reference to FIG. 1 may be disposed under the source structure STS and the peripheral contact plug CTP. In other words, the peripheral circuit structure PC may be disposed between the substrate SUB and the source structure STS. The substrate SUB may include well regions doped with an n type or p type impurity and each of the well regions of the substrate SUB may include active regions divided by an isolation layer ISO. The isolation layer ISO may include an insulating material.

The peripheral circuit structure PC may include peripheral gate electrodes PG, gate insulating layer GI, junctions Jn, peripheral circuit wires PCL, lower contact plugs PCP, and a lower insulating layer LIL. The peripheral gate electrodes PG may serve as gate electrodes of an NMOS transistor and a PMOS transistor of the peripheral circuit structure PC, respectively. The gate insulating layer GI may be disposed between each of the peripheral gate electrodes PG and the substrate SUB. The junctions Jn may be a region defined by injecting an n type or p type impurity into the active region overlapped with each of the peripheral gate electrodes PG. The junctions Jn may be disposed at both sides of each of the peripheral gate electrodes PG. One of the junctions Jn disposed at both sides of the peripheral gate electrodes PG may serve as a source junction and the other of the junctions Jn disposed at both sides of the peripheral gate electrodes PG may serve as a drain junction. The peripheral circuit wires PCL may be electrically coupled to a circuit of the peripheral circuit structure PC through the lower contact plugs PCP.

The circuit of the peripheral circuit structure PC may include an NMOS transistor, a PMOS transistor, a resistor, and a capacitor as described with reference to FIG. 1. For example, an NMOS transistor may be coupled to the peripheral circuit wires PCL through the lower contact plugs PCP.

The lower insulating layer LIL may cover the circuit of the peripheral circuit structure PC, the peripheral circuit wires PCL and the lower contact plugs PCP. The lower insulating layer LIL may include insulating layers stacked in multiple layers.

The peripheral contact plug CTP may pass through the lower insulating layer LIL to be coupled to one of the peripheral circuit wires PCL. For example, the peripheral contact plug CTP may pass through the second stack structure ST2, pass through insides of the second penetrating portion OP2 and the first penetrating portion OP1 and extend into the lower insulating layer LIL. The peripheral contact plug CTP according to an example may be coupled to the peripheral circuit wire PCL disposed under the first penetrating portion OP1. The peripheral circuit wire PCL disposed under the first penetrating portion OP1 may be electrically coupled to an NMOS transistor which constitutes a block select transistor.

The source structure STS may include a doped semiconductor structure DS disposed on the lower insulating layer LIL. The doped semiconductor structure DS may include at least one doped semiconductor layer. For example, the doped semiconductor structure DS may include an n type doped semiconductor layer doped with an n type impurity. Alternatively, the doped semiconductor structure DS may have a stacked structure of a p type doped semiconductor layer doped with a p type impurity and an n type doped semiconductor layer doped with an n type impurity. The n type doped semiconductor layer may serve as a source region of a memory string and the p type doped semiconductor layer may serve as a well structure.

The source structure STS may further include an insulating layer MIL formed on the doped semiconductor structure DS and an etch stop layer ES formed on the insulating layer MIL. The doped semiconductor structure DS, the insulating layer MIL, and the etch stop layer ES of the source structure STS may be completely penetrated by the first penetrating portion OP1.

The insulating layer MIL may include an oxide layer and the etch stop layer ES may include a material having a high etch resistance when interlayer insulating layers ILD and sacrificial insulating layers SC are etched. For example, the etch stop layer ES may include a silicon layer such as a polysilicon layer, etc.

Although an example in which the source structure STS includes the doped semiconductor structure DS, the insulating layer MIL, and the etch stop layer ES is illustrated, the embodiments not limited thereto. For example, the source structure STS may include the doped semiconductor structure DS only. In other words, the insulating layer MIL and the etch stop layer ES may be omitted. According to this example, the first stack structure ST1 may directly contact the doped semiconductor structure DS to be disposed on the doped semiconductor structure DS.

The first stack structure ST1 may be disposed on the source structure STS. The second penetrating portion OP2 passing through the first stack structure ST1 may overlap the first penetrating portion OP1. As described above with reference to FIG. 2A, the source structure STS may include the protruding portion protruding further towards the center region of the second penetrating portion OP2 in the horizontal direction than the first stack structure ST1.

The first penetrating portion OP1 and the second penetrating portion OP2 may be buried by an insulating pattern FI. The insulating pattern FI may include an insulating material such as an oxide layer. An Edge of the second penetrating portion OP2 may be closer to the first slits than an edge of the first penetrating portion OP1 so that the protruding portion of the source structure STS is exposed by the second penetrating portion OP2. Thereby, a cross-sectional structure of the insulating pattern FI may be a T shape.

The second stack structure ST2 may be disposed on the first stack structure ST1 and extend to cover the insulating pattern FI. The second stack structure ST2 may include a gate stack structure GST and a dummy stack structure DM. The gate stack structure GST may overlap the first stack structure ST1. The dummy stack structure DM may extend from the gate stack structure GST and overlap the first penetrating portion OP1, the second penetrating portion OP2, and the Insulating pattern FI.

Each of the insulating bars IB may be disposed at a boundary between the gate stack structure GST and the dummy stack structure DM. The insulating bars IB may pass through the second stack structure ST2 and the first stack structure ST1. The insulating pillars IP may extend to pass through the first stack structure ST1 and the gate stack structure GST at a region where the first stack structure ST1 and the gate stack structure GST of the second stack structure ST2 are overlapped.

Each of the gate stack structure GST and the first stack structure ST1 may include the interlayer insulating layers ILD and conductive patterns CP which are alternately stacked. The interlayer insulating layers ILD of the gate stack structure GST may extend in the horizontal direction to overlap the first penetrating portion OP1, the second penetrating portion OP2, and the insulating pattern FI. Portions of the interlayer insulating layers ILD which extend to overlap the first penetrating portion OP1, the second penetrating portion OP2, and the insulating pattern FI may be defined as dummy interlayer insulating layers DIL. The dummy stack structure DM may include the dummy interlayer insulating layers DIL and the sacrificial insulating layers SC disposed between the dummy interlayer insulating layers DIL. In other words, the dummy stack structure DM may include the dummy interlayer insulating layers DIL and the sacrificial insulating layers SC alternately stacked to each other.

The peripheral contact plug CTP may pass through the dummy interlayer insulating layers DIL and the sacrificial insulating layers SC of the dummy stack structure DM. In addition, the peripheral contact plug CTP may pass through the insulating pattern FI and extend into the lower insulating layer LIL to be coupled to the peripheral circuit wire PCL disposed under the insulating pattern FI.

The conductive patterns CP each may include various conductive materials such as a doped silicon layer, a metal layer, a metal silicide layer, and a barrier layer, and include two or more types of conductive materials. For example, each of the conductive patterns CP may include tungsten and a titanium nitride (TiN) layer enclosing a surface of the tungsten. Tungsten is a low-resistance metal and may lower a resistance of each of the conductive patterns CP. A titanium nitride (TiN) layer is a barrier layer and may prevent direct contact between tungsten and the interlayer insulating layers ILD. The interlayer insulating layers ILD may include an insulating material such as an oxide layer. The sacrificial insulating layers SC may include a different material from the interlayer insulating layers ILD. For example, the sacrificial insulating layers SC may include a material having a significantly different etch rate from the interlayer insulating layers ILD to minimize damage to the interlayer insulating layers ILD and selectively etch the sacrificial insulating layers SC. For example, the sacrificial insulating layers SC may include a nitride layer.

The conductive patterns CP may serve as source select lines SSL1 and SSL2, word lines WL, and drain select lines DSL. The source select lines SSL1 and SSL2 may serve as gate electrodes of source select transistors, the word lines WL may serve as gate electrodes of memory cells, and the drain select lines DSL may serve as gate electrodes of drain select transistors.

The uppermost conductive pattern and some conductive patterns successively disposed under the uppermost conductive pattern among the conductive patterns CP of the gate stack structure GST may serve as the drain select lines DSL. FIG. 2B illustrates an example in which the uppermost conductive pattern and two conductive patterns successively disposed under the uppermost conductive pattern of the gate stack structure GST. However, the embodiments are not limited thereto. For example, only the uppermost conductive pattern of the gate stack structure GST may serve as a drain select line, or each of the uppermost conductive pattern and a single layer immediately under the uppermost conductive pattern may serve as a drain select line. The rest of the conductive patterns of the gate stack structure GST which are disposed under the conductive patterns serving as the drain select lines DSL may serve as the word lines WL.

The conductive patterns CP of the first stack structure ST1 may serve as the first source select lines SSL1 and the second source select lines SSL2. The first source select lines SSL1 may be separated from the second source select lines SSL2 by the connection structure of the second penetrating portion OP2 and the second slit SI2 shown in FIG. 2A. FIG. 2B illustrates the first stack structure ST1 including three layers of the first source select lines SSL1 and three layers of the second source select lines SSL2. However, the embodiments are not limited thereto. For example, the first stack structure ST1 may include a single layer of conductive pattern divided into a first source select line and a second source select line, or two or more layers of conductive patterns divided into first source select lines and second source select lines.

Each of the first slits SI1 may be filled with a sidewall insulating layer SWI and a source contact structure SCT. The sidewall insulating layer SWI may extend along a sidewall of the first stack structure ST1 and a sidewall of the second stack structure ST2 which are exposed by a sidewall of each of the first slits SI1. The source contact structure SCT may be insulated from the conductive patterns CP by the sidewall insulating layer SWI. The source contact structure SCT may extend into the source structure STS and contact the doped semiconductor structure DS. The source contact structure SCT may include various conductive materials such as a doped silicon layer, a metal layer, a metal silicide layer, and a barrier layer. The source contact structure SCT may include two or more types of conductive materials. For example, the source contact structure SCT may include a stacked structure of a doped silicon layer contacting the doped semiconductor structure DS and a metal layer formed on the doped silicon layer. The doped silicon layer may include an n type dopant and the metal layer may include a low-resistance metal such as tungsten to lower a resistance.

Figure 3:
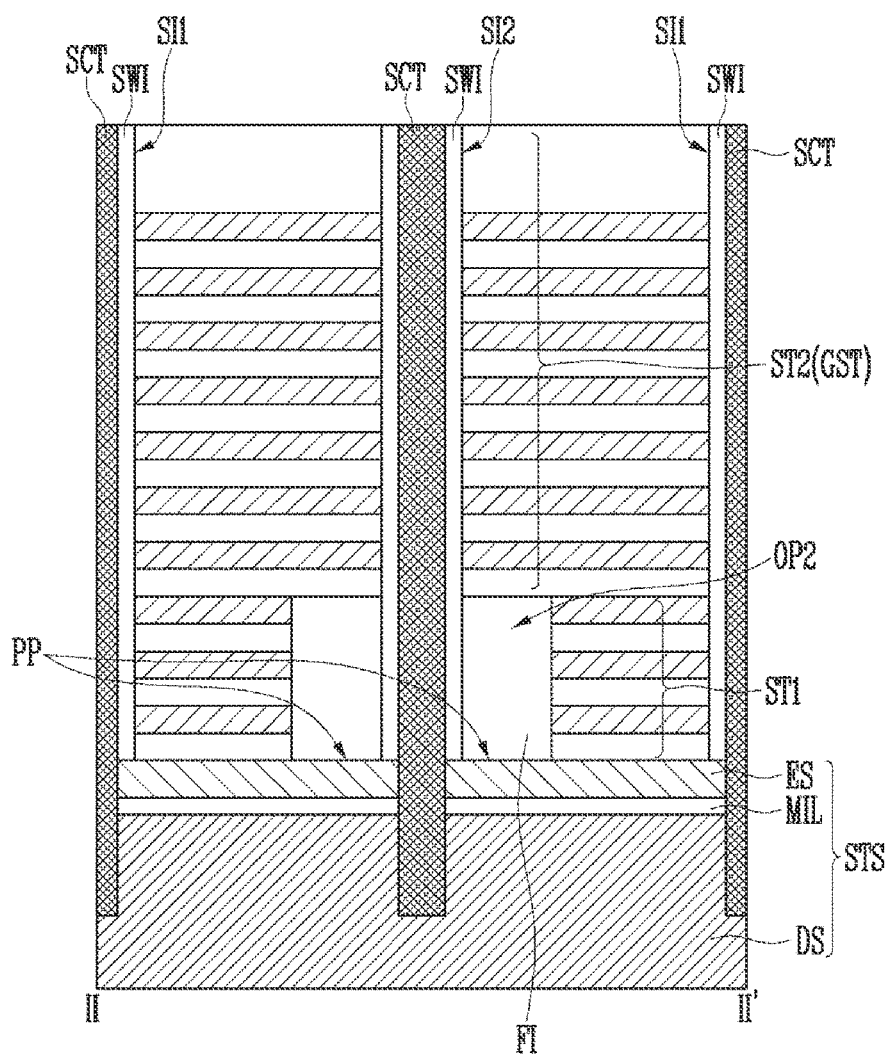
FIG. 3 is a cross-sectional diagram illustrating an arrangement of a protruding portion of a source structure, a second penetrating portion, and a second slit.

FIG. 3 is a cross-sectional diagram illustrating an arrangement of a protruding portion of a source structure, a second penetrating portion, and a second slit. For example, FIG. 3 is a cross-sectional diagram taken along line II-II' of FIG. 2A.

Referring to FIG. 3, as described with reference to FIG. 2A, a protruding portion PP of the source structure STS may protrude further towards the center of the second penetrating portion OP2 in the horizontal direction than the edge of the first stack structure ST1 which is defined by the second penetrating portion OP2.

The second slit SI2 might not overlap the first penetrating portion OP1 shown in FIG. 2A, but may extend to cross one side of the edge region of the second penetrating portion OP2 extending to be wider than the first penetrating portion OP1. Thereby, a portion of the second slit SI2 may be aligned on the protruding portion PP of the source structure STS not penetrated by the first penetrating portion OP1 shown in FIG. 2A. The second slit SI2 may pass through the insulating pattern FI disposed on the protruding portion PP of the source structure STS.

The gate stack structure GST of the second stack structure ST2 may extend toward the first slits SI1 from the second slit SI2 and overlap the first stack structure ST1.

The inside of the second slit SI2 may have the same structure as the inside of each of the first slits SI1. For example, the second slit SI2 may be filled with the sidewall insulating layer SWI and the source contact structure SCT described above with reference to FIG. 2B. The sidewall insulating layer SWI may extend along a sidewall of the insulating pattern FI and a sidewall of the second stack structure ST2 which are exposed along a sidewall of the second slit SI2. The source contact structure SCT may pass through the etch stop layer ES and the insulating layer MIL of the source structure STS and contact the doped semiconductor structure DS.

Figure 4A:
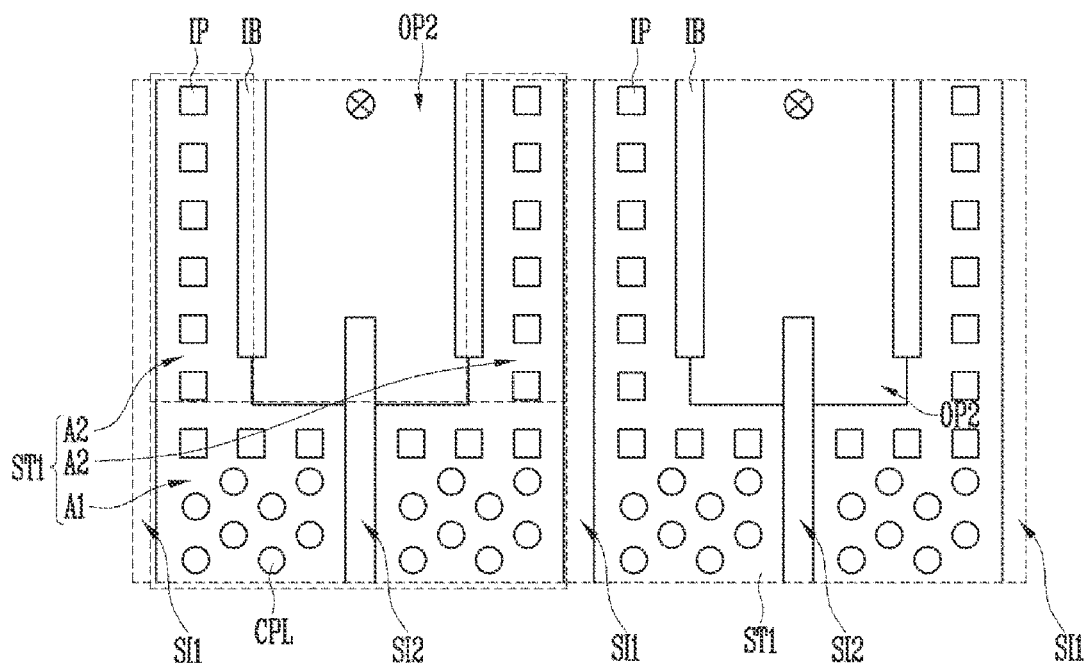
FIGS. 4A and 4B are diagrams illustrating a layout of a first stack structure and a layout of a second stack structure, respectively.
Figure 4B:
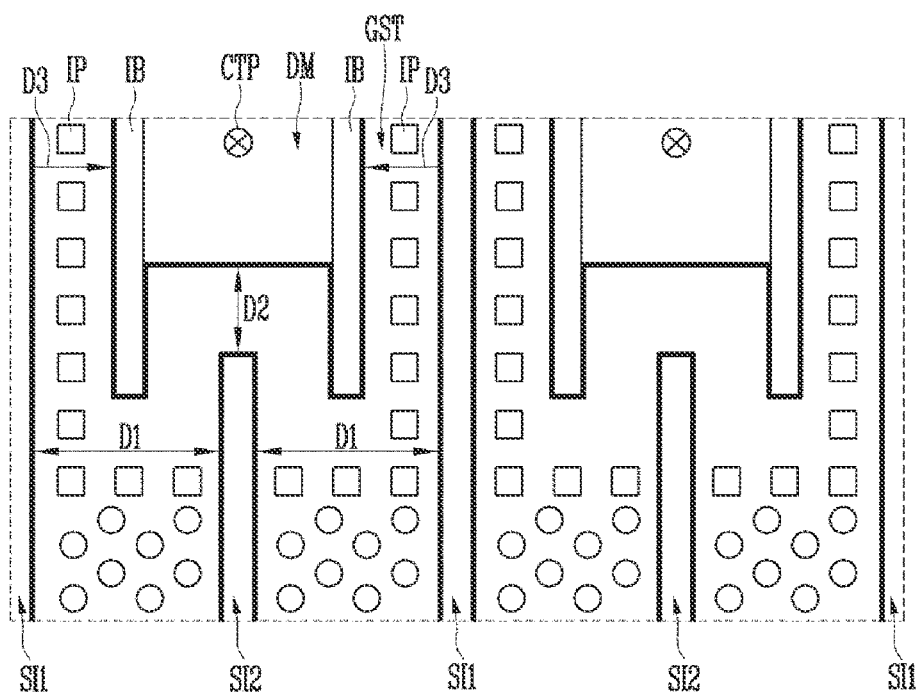

FIGS. 4A and 4B are diagrams illustrating a layout of a first stack structure and a layout of a second stack structure, respectively.

Referring to FIG. 4A, the first stack structure ST1 may be divided into a first region A1 and second regions A2. The first region A1 of the first stack structure ST1 may be penetrated by the channel pillars CPL. The second regions A2 of the first stack structure ST1 may extend from the first region A1 and be divided from each other by the second penetrating portion OP2. In other words, the second regions A2 of the first stack structure ST1 may extend from the first region A1 to be disposed at opposite sides of the second penetrating portion OP2. The opposite sides of the second penetrating portion OP2 may face the first silts SI1.

The first region A1 may be divided into sub-regions by the second slit SI2 extending to cross one side of the second penetrating portion OP2. The sub-regions may be coupled to the second regions A2, respectively.

The first region A1 and the second regions A2 may be penetrated by the insulating pillars IP. The insulating pillars IP penetrating the first region A1 may be disposed between the channel pillars CPL and the second penetrating portion OP2. The insulating pillars IP penetrating each of the second regions A2 may be disposed between the second penetrating portion OP2 and the first slit SI1.

The insulating bar IB may extend to overlap each of side portions of the second penetrating portion OP2 aligned with the first slits SI1.

Referring to FIG. 4B, as described with reference to FIG. 2B, the second stack structure may include the gate stack structure GST and the dummy stack structure DM. For convenience of recognition, an edge of the gate stack structure GST is shown in a thick line.

A conductive material flows in from the first slits SI1 and the second slit SI2 in the horizontal direction, so that the gate stack structure GST may be formed. A first width D1 between each of the first slits SI1 and the second slit SI2 may be completely filled with the conductive material. The conductive material may flow in from the first slits SI1 and the second slit SI2 as much as a second width D2 in the horizontal direction. The first width D1 may be equal to or smaller than the double of the second width D2.

In a plan view, the conductive material might not flow in a region between the first slits SI1 neighboring each other which is spaced apart by a distance equal to or greater than the second width D2 from the second slit SI2. The dummy stack structure DM may be defined at the region in which the conductive material does not flow. The gate stack structure GST may have a third width D3 smaller than the second width D2 between the insulating bars IB and the first slits SI1. The third width D3 is not limited to be smaller than the second width D2, and may be equal to the second width D2.

The dummy stack structure DM may overlap the second penetrating portion OP2 shown in FIG. 4A. The gate stack structure GST may extend from the dummy stack structure DM to overlap the first region A1 and the second regions A2 of the first stack structure ST1 shown in FIG. 4A.

Figure 5A:
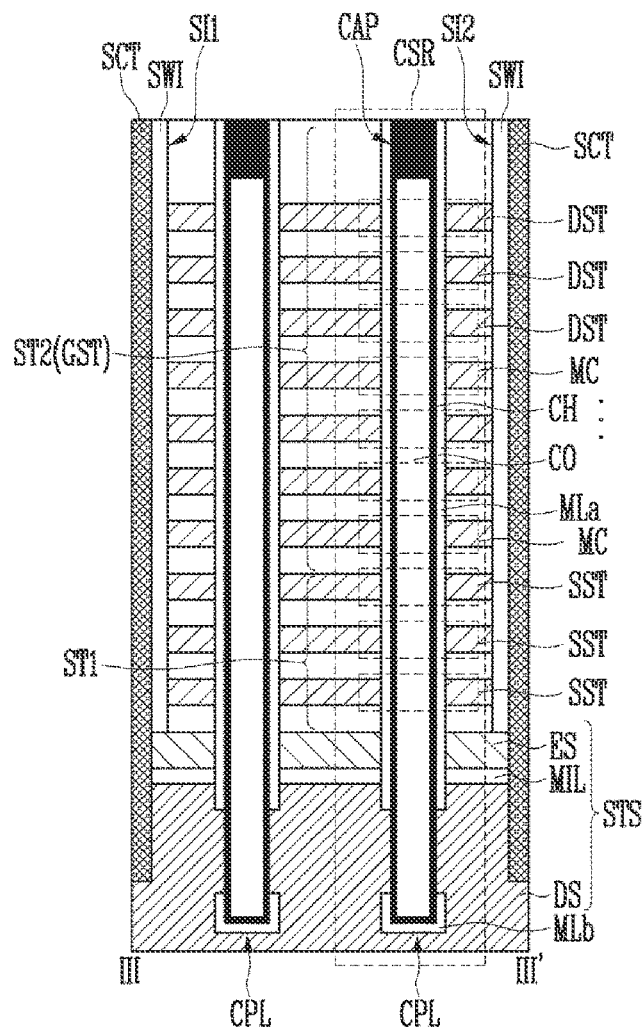
FIGS. 5A and 5B are diagrams illustrating a longitudinal section and a cross section of a channel pillar, respectively.
Figure 5B:
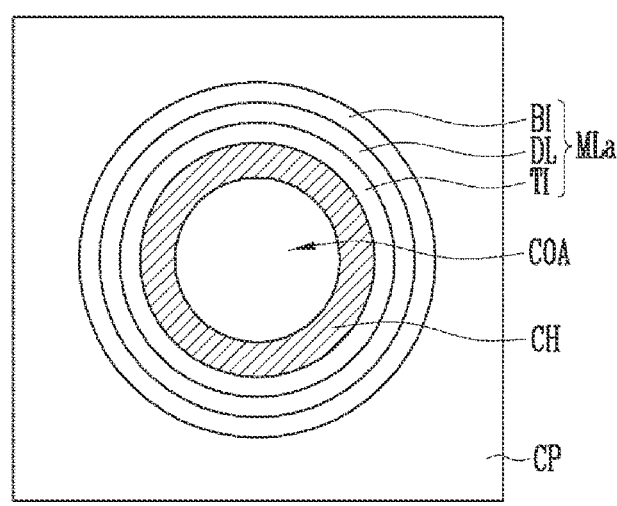

FIGS. 5A and 5B are diagrams illustrating a longitudinal section and a cross section of a channel pillar, respectively. For example, FIG. 5A is a longitudinal diagram taken along line III-III' of FIG. 2A, and FIG. 5B is a cross-sectional diagram taken at a level of one of the word lines WL shown in FIG. 2B in a transverse direction.

Referring to FIG. 5A, each of the channel pillars CPL may include a channel layer CH passing through the first stack structure ST1 and the gate stack structure GST and first and second multilayer patterns MLa and MLb enclosing the channel layer CH. The channel layer CH may serve as a channel of a cell string CSR. The channel layer CH may include a semiconductor layer. For example, the channel layer CH may include a silicon layer. The channel layer CH may directly contact the doped semiconductor structure DS.

Each of the channel pillars CPL may further include a core insulating layer CO and a capping conductive pattern CAP which fill a core region. The core insulating layer CO may be enclosed by the channel layer CH, and the capping conductive pattern CAP may be disposed on the core insulating layer CO. The capping conductive pattern CAP may include a doped semiconductor layer. For example, the capping conductive pattern CAP may include an n type doped silicon layer. The capping conductive pattern CAP may serve as a drain junction of the cell string CSR.

Each of the channel pillars CPL may extend into the source structure STS. For example, each of the channel pillars CPL may pass through the etch stop layer ES and the insulating layer MIL to extend into the doped semiconductor structure DS. The channel layer CH may have a sidewall extending into the doped semiconductor structure DS and directly contacting the doped semiconductor structure DS.

The first multilayer pattern MLa and the second multilayer pattern MLb may be separated from each other by the doped semiconductor structure DS contacting the sidewall of the channel layer CH. Each of the first multilayer pattern MLa and the second multilayer pattern MLb may extend along an outer wall of the channel layer CH. For example, the first multilayer pattern MLa may extend between the channel layer CH and the first stack structure ST1 and between the channel layer CH and the gate stack structure GST of the second stack structure ST2. The second multilayer pattern MLb may extend between a portion of the doped semiconductor structure DS disposed under a contact surface of the channel layer CH and the doped semiconductor structure DS and the channel layer CH.

Referring to FIG. 5B, the first multilayer pattern MLa disposed between the channel layer CH and the conductive pattern CP may include a tunnel insulating layer TI enclosing the channel layer CH, a data storage layer DL enclosing the tunnel insulating layer TI, and a blocking insulating layer BI enclosing the data storage layer DL. The data storage layer DL may store data changed using Fowler-Nordheim tunneling caused by a difference in voltage between the word line WL of FIG. 2B and the channel layer CH. For this operation, the data storage layer DL may include various materials, for example, a nitride layer capable of trapping charges. The embodiments may not be limited thereto, and the data storage layer DL may include silicon, a phase-change material, a nanodot, and the like. The blocking insulating layer BI may include an oxide layer capable of blocking charges. The tunnel insulating layer TI may include a silicon oxide layer in which charge tunneling is available.

The channel layer CH may have a ring shape defining a core region COA. The core region COA may be completely filled with the channel layer CH or be filled with at least one of the core insulating layer CO and the capping conductive pattern CAP shown in FIG. 5A.

Referring to FIG. 5A, source select transistors SST may be formed at intersections of conductive patterns of the first stack structure ST1 and each of the channel layers CH. Memory cells MC may be formed at intersections of word lines among conductive patterns of the gate stack structure GST and each of the channel layers CH, and drain select transistors DST may be formed at intersections of drain select lines among the conductive patterns of the gate stack structure GST and each of the channel layers CH. The source select transistors SST, the memory cells MC, and the drain select transistors DST which are coupled in series by the channel layer CH may form the three-dimensional cell string CSR.

The second multilayer pattern MLb may include the tunnel insulating layer TI, the data storage layer DL, and the blocking insulating layer BI which are shown in FIG. 5B.

Figure 6:
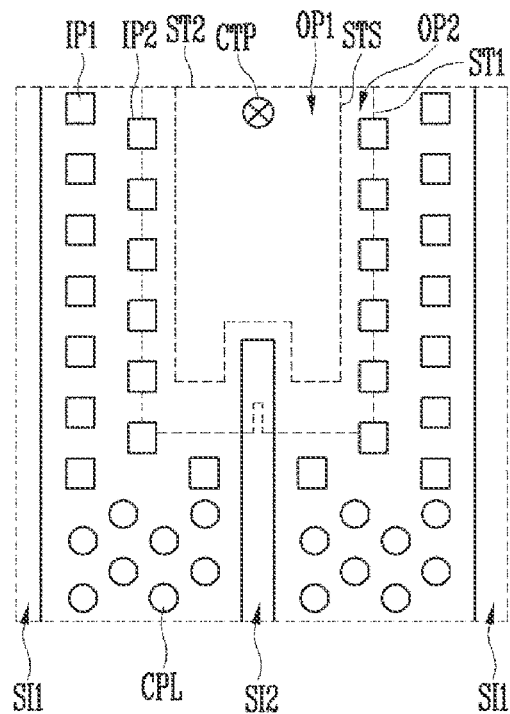
FIGS. 6 and 7 are diagrams illustrating examples of variations of supporting structures.
Figure 7:
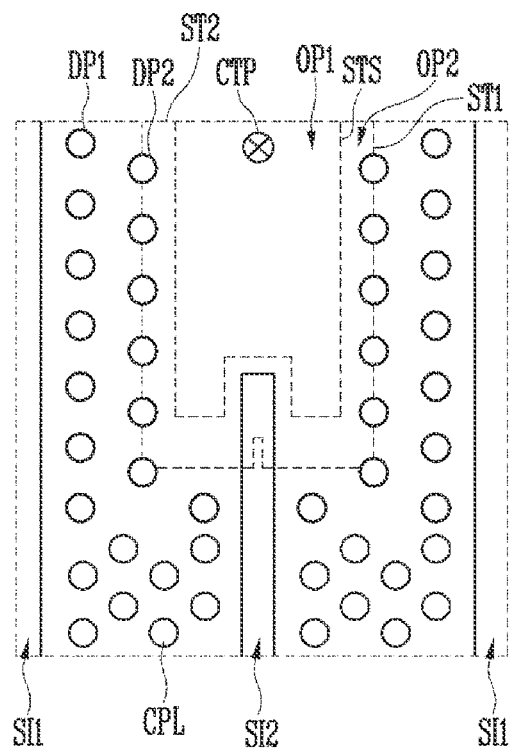

FIGS. 6 and 7 are diagrams illustrating examples of variations of supporting structures.

Structures of the first slits SI1, the second slit SI2, the first stack structure ST1, the second stack structure ST2, the source structure STS, the first penetrating portion OP1, the second penetrating portion OP2, the peripheral contact plug CTP, and the channel pillars CPL, respectively, shown in FIGS. 6 and 7 may be the same as the structures described with reference to FIG. 2A.

Referring to FIG. 6, the supporting structures may include insulating pillars IP1 and IP2 only. The insulating pillars IP1 and IP2 may include the first insulating pillars IP1 and the second insulating pillars IP2. The first insulating pillars IP1 may be collinearly arranged in a row direction along a direction in which the first slits SI1 extend. The second insulating pillars IP2 may be collinearly arranged in the row direction. A first row which consists of the first insulating pillars IP1 and a second row which consists of the second insulating pillars IP2 may be alternately disposed in a direction perpendicularly crossing the row direction. The first insulating pillars IP1 and the second insulating pillars IP2 may form a zigzag pattern.

The first insulating pillars IP1 and the second insulating pillars IP2 may suppress inflow of an etching material or a conductive material for a conductive pattern towards a region where the peripheral contact plug CTP is disposed when a process for manufacturing a semiconductor device is performed.

Referring to FIG. 7, the supporting structures may include dummy channel pillars DP1 and DP2 only. The dummy channel pillars DP1 and DP2 may include the first dummy channel pillars DP1 and the second dummy channel pillars DP2. The first dummy channel pillars DP1 may be collinearly arranged in a row direction along a direction in which the first slits SI1 extend. The second dummy channel pillars DP2 may be collinearly arranged in the row direction. A first row which consists of the first dummy channel pillars DP1 and a second row which consists of the second dummy channel pillars DP2 may alternately disposed in a direction perpendicularly crossing the row direction. The first dummy channel pillars DP1 and the second dummy channel pillars DP2 may form a zigzag pattern.

The first dummy channel pillars DP1 and the second dummy channel pillars DP2 may suppress inflow of an etching material or a conductive material for a conductive pattern towards a region where the peripheral contact plug CTP is disposed when a process for manufacturing a semiconductor device is performed. The first dummy channel pillars DP1 and the second dummy channel pillars DP2 may have the same structure as the channel pillars CPL shown in FIG. 5A, respectively.

FIGS. 8A to 8K are cross-sectional diagrams illustrating a method of manufacturing a semiconductor device according to an embodiment. For example, FIGS. 8A to 8K are cross-sectional diagrams taken along lines I-I' and IV-IV' of FIG. 2A and illustrating phased manufacturing processes.

Figure 8A:
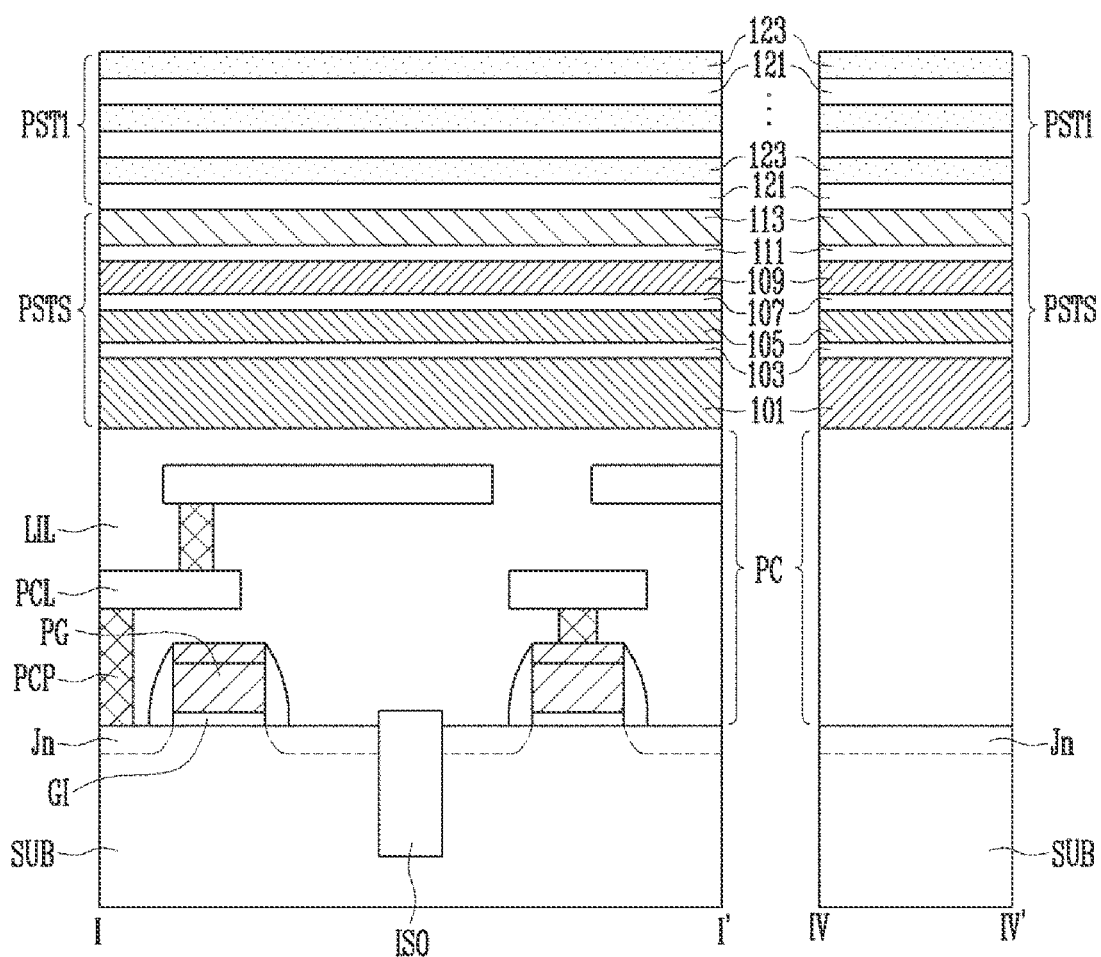
FIGS. 8A to 8K are cross-sectional diagrams illustrating a method of manufacturing a semiconductor device according to an embodiment.

Referring to FIG. 8A, the isolation layer ISO defining an active region of the substrate SUB may be formed in the substrate SUB. Thereafter, the gate insulating layer GI, the peripheral gate electrodes PG, the junctions Jn, the peripheral circuit wires PCL, the lower contact plugs PCP, and the lower insulating layer LIL which constitute the peripheral circuit structure PC described with reference to FIG. 2B may be formed.

Subsequently, a source stack structure PSTS may be formed on the lower insulating layer LIL. The source stack structure PSTS may include at least one doped semiconductor layer. For example, the source stack structure PSTS may include a first doped semiconductor layer 101, a source sacrificial layer 105, and a second doped semiconductor layer 109 sequentially stacked. The source stack structure PSTS may further include a first protective layer 103 disposed between the first doped semiconductor layer 101 and the source sacrificial layer 105 and a second protective layer 107 disposed between the source sacrificial layer 105 and the second doped semiconductor layer 109. Selectively, the source stack structure PSTS may further include an insulating layer 111 and an etch stop layer 113 sequentially stacked on the second doped semiconductor layer 109.

The first doped semiconductor layer 101, the second doped semiconductor layer 109, and the etch stop layer 113 may include doped silicon layers. The first doped semiconductor layer 101, the second doped semiconductor layer 109, and the etch stop layer 113 may include n type dopants. The first protective layer 103, the second protective layer 107, and the insulating layer 111 may include oxide layers. The source sacrificial layer 105 may include an undoped semiconductor layer, for example, an undoped silicon layer.

Subsequently, a first stack structure PST1 including at least a pair of a first material layer 121 and a second material layer 123 may be formed on the source stack structure PSTS. The number of the first material layers 121 and the second material layers 123 to be alternately stacked may vary according to the number of the source select lines to be stacked which may be formed. For example, the first stack structure PST1 may include two or more first material layers 121 and two or more second material layers 123.

Each of the first material layers 121 may include an insulating material used for an interlayer insulating layer, and each of the second material layers 123 may include an insulating material used for a sacrificial insulating layer. The second material layers 123 may include a material different from that of the first material layers 121. For example, the second material layers 123 may include a material which may be etched and minimize etching of the first material layers 121 during a process in which the second material layers 123 are selectively etched. In other words, the second material layers 123 may include a material having a significantly different etch rate from the first material layers 121. For example, the first material layers 121 may include oxide layers such as silicon oxide ($SiO_2$) layers, and the second material layers 123 may include nitride layers such as silicon nitride (SiN) layers.

Figure 8B:
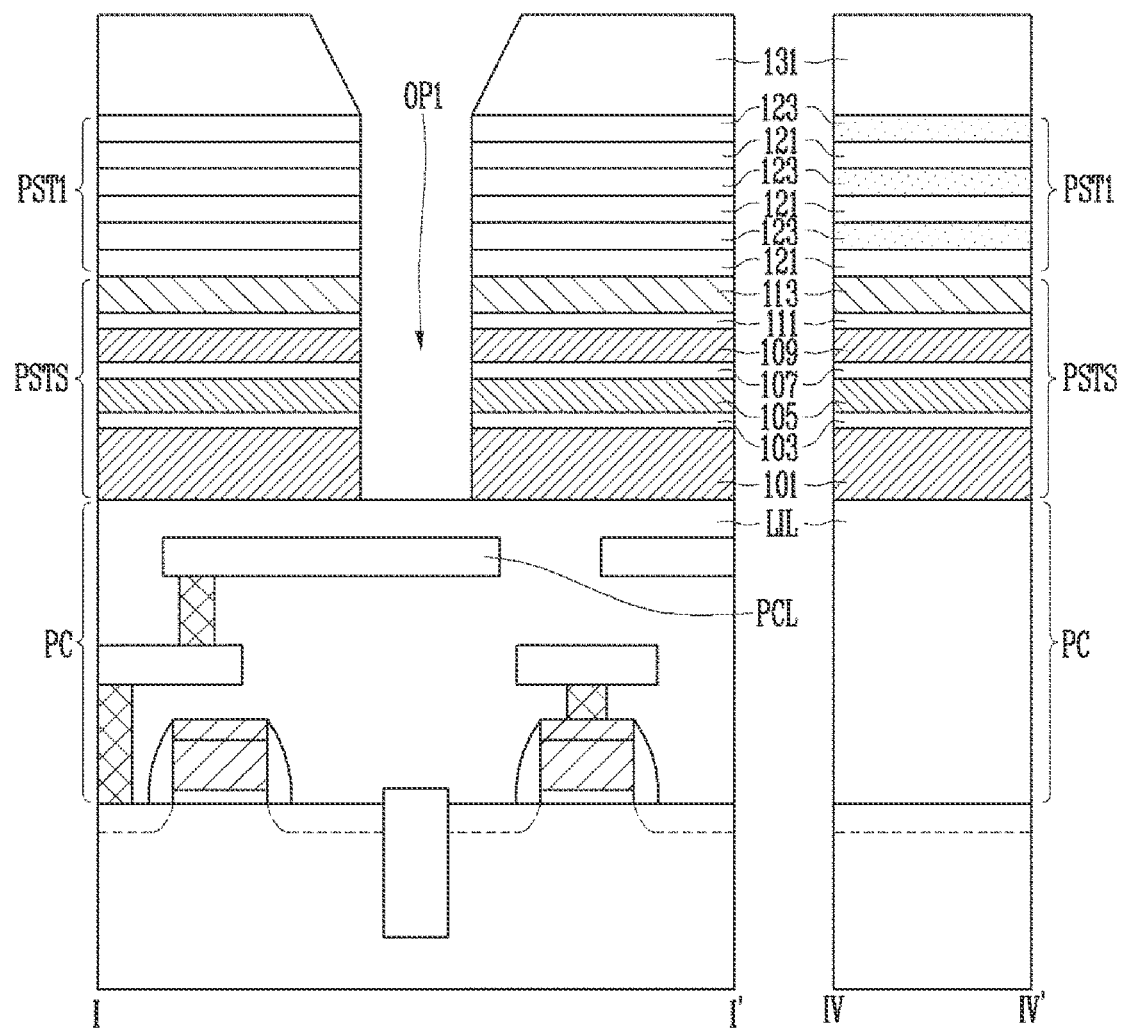

Referring to FIG. 8B, a mask pattern 131 may be formed on the first stack structure PST1 including the first material layers 121 and the second material layers 123 alternately stacked. The mask pattern 131 may be patterned using a photolithography process.

Subsequently, the first stack structure PST1 and the source stack structure PSTS may be etched by an etching process using the mask pattern 131 as an etching barrier. Thereby, the first penetrating portion OP1 completely passing through the first stack structure PST1 and the source stack structure PSTS may be formed. The first penetrating portion OP1 may expose the lower insulating layer LIL. The first penetrating portion OP1 may be formed before a second stack structure is formed. According to an embodiment, a depth of the first penetrating portion OP1 may be easily controlled since the first penetrating portion OP1 might not pass through the second stack structure to be formed later but pass through the first stack structure PST1 and the source stack structure PSTS. In addition, each of the etch stop layer 113, the second doped semiconductor layer 109, the source sacrificial layer 105, and the first doped semiconductor layer 101 of the source stack structure PSTS may serve as an etch stop layer when the etching process for forming the first penetrating portion OP1 is performed. Thereby, a phenomenon in which conductive patterns of the peripheral circuit structure PC which are protected by the lower insulating layer LIL (for example, the peripheral circuit wires PCL) are damaged may be prevented during the etching process for forming the first penetrating portion OP1.

The mask pattern 131 may be removed after forming the first penetrating portion OP1.

Figure 8C:
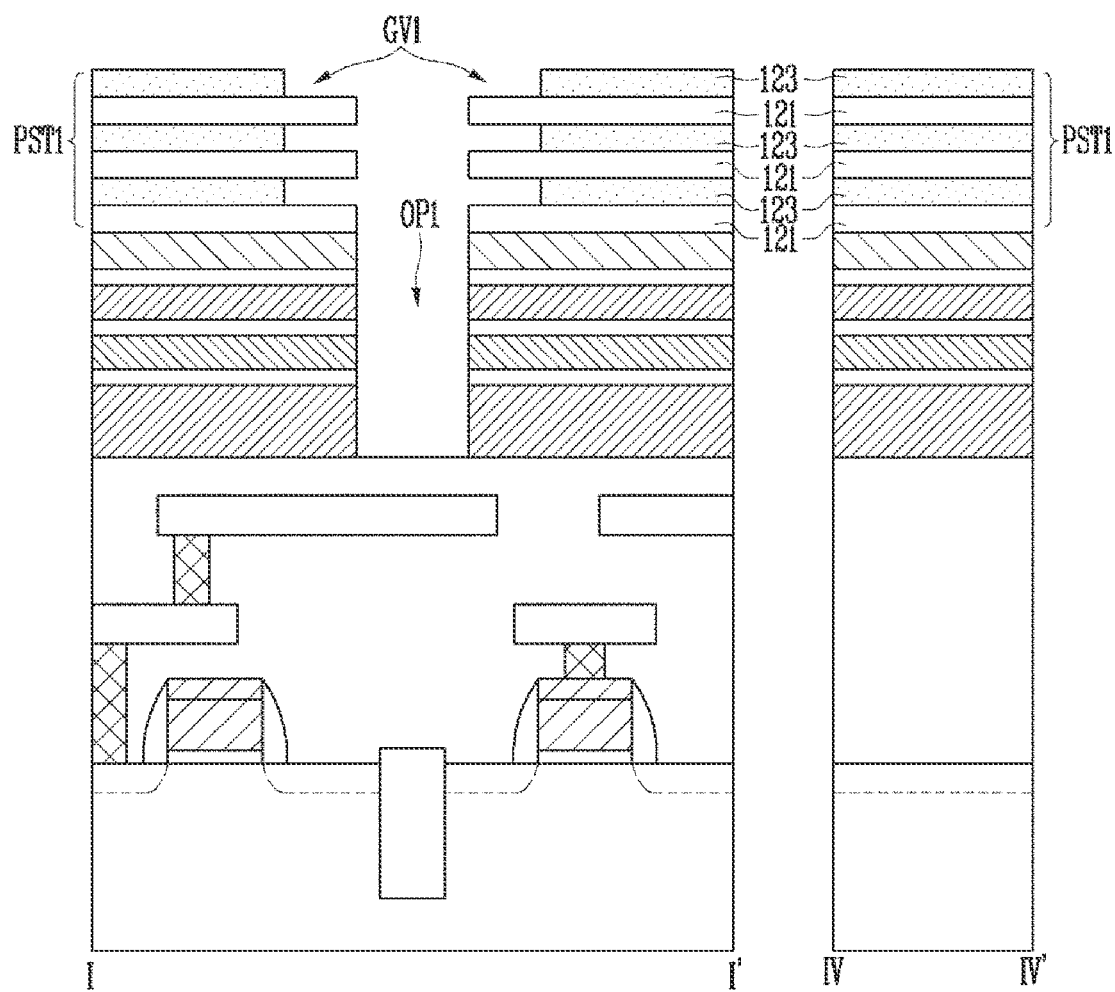

Referring to FIG. 8C, the second material layers 123 exposed by a side portion of the first penetrating portion OP1 may be selectively etched. The second material layers 123 may be selectively etched by a wet etching process. For example, the second material layers 123 may be selectively etched using phosphoric acid. By selectively etching the second material layers 123, the first material layers 121 may remain in a form protruding further towards the first penetrating portion OP1 than the second material layers 123. Thereby, first grooves GV1 may be formed on a sidewall of the first stack structure PST1 defined by the first penetrating portion OP1.

Figure 8D:
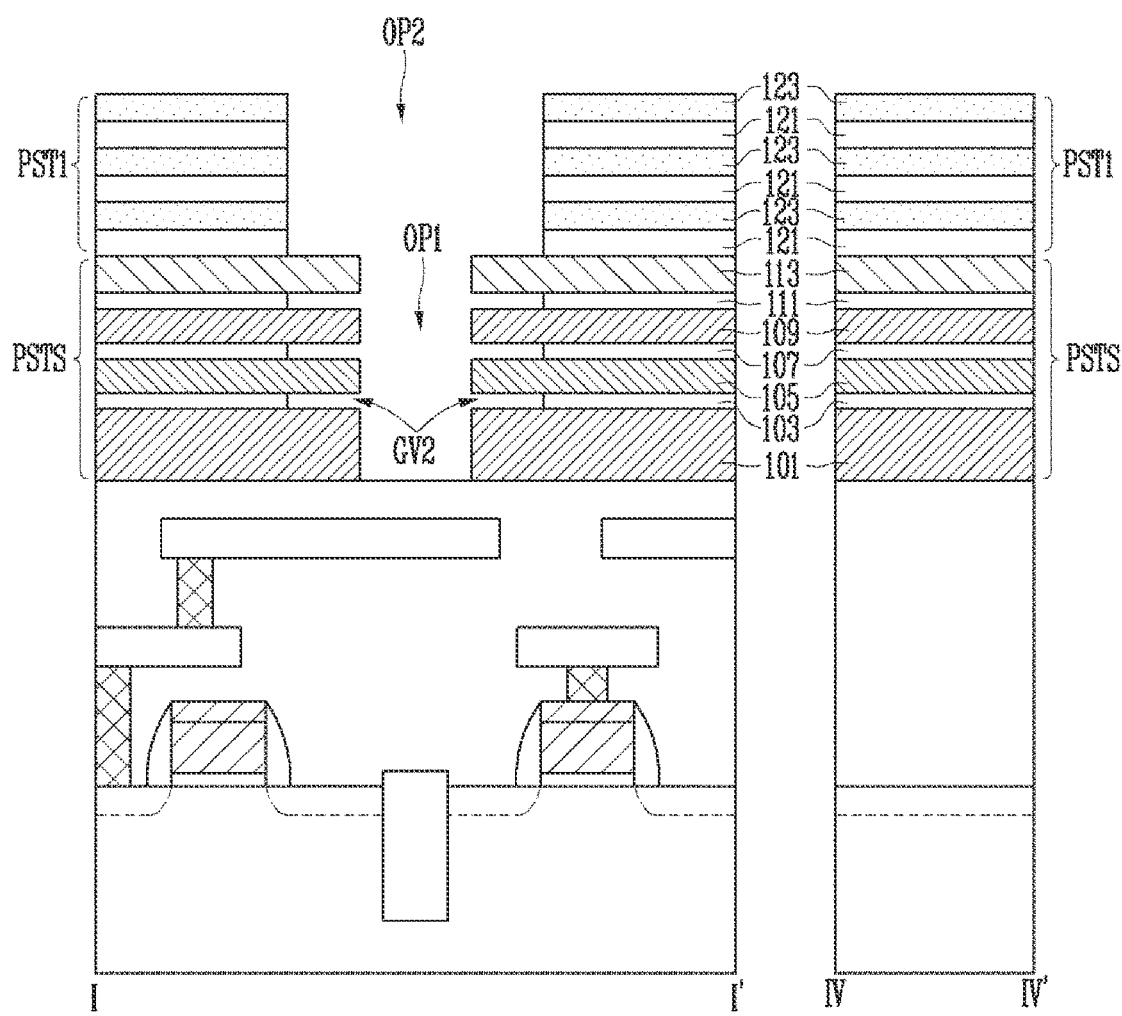

Referring to FIG. 8D, the first material layers 121 exposed by the side portion of the first penetrating portion OP1 may be selectively etched. The first material layers 121 may be selectively etched by a dry etching process. The first grooves GV1 shown in FIG. 8C may be removed by selectively etching the first material layers 121.

When the first material layers 121 are selectively etched, a portion of each of the first protective layer 103, the second protective layer 107, and the insulating layer 111 which includes an oxide layer may be etched from the side portion of the first penetrating portion OP1. Thereby, the etch stop layer 113, the second doped semiconductor layer 109, the source sacrificial layer 105, and the first doped semiconductor layer 101 may remain in a form protruding further towards the first penetrating portion OP1 than the first protective layer 103, the second protective layer 107 and the insulating layer 111. Thereby, second grooves GV2 may be formed on a sidewall of the source stack structure PSTS defined by the first penetrating portion OP1.

As described with reference to FIGS. 8C and 8D, the second penetrating portion OP2 exposing a top surface of the source stack structure PSTS may be formed by etching the first material layers 121 and the second material layers 123 of the first stack structure PST1 from the side portion of the first penetrating portion OP1. The second penetrating portion OP2 may be patterned to be automatically aligned with the first penetrating portion OP1 by the selective etching process of the second material layers 123 and the selective etching process of the first material layers 121 without separately forming a mask pattern. Thereby, the manufacturing process of the semiconductor device in accordance with the embodiments of the present disclosure may be simplified.

Figure 8E:
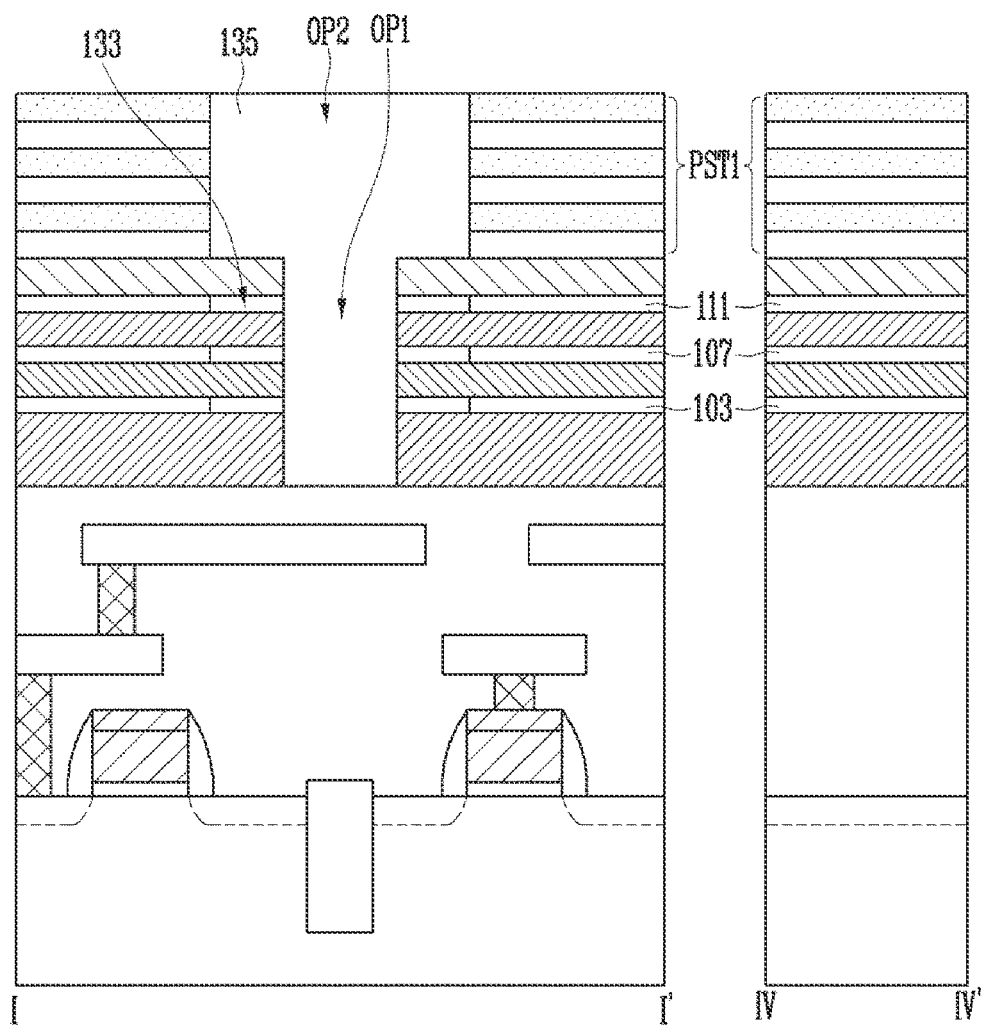

Referring to FIG. 8E, an insulating pattern 135 filling the first penetrating portion OP1 and the second penetrating portion OP2 may be formed. The insulating pattern 135 may include an oxide layer. A surface of the insulating pattern 135 may be planarized to expose a top surface of the first stack structure PST1. Chemical Mechanical Polishing (CMP) may be used to planarize the insulating pattern 135.

A gap 133 may be formed between each of the first protective layer 103, the second protective layer 107, and the insulating layer 111, and the insulating pattern 135 by the second grooves GV2 shown in FIG. 8D. Alternatively, the second grooves GV2 shown in FIG. 8D may be filled with the insulating pattern 135.

Figure 8F:
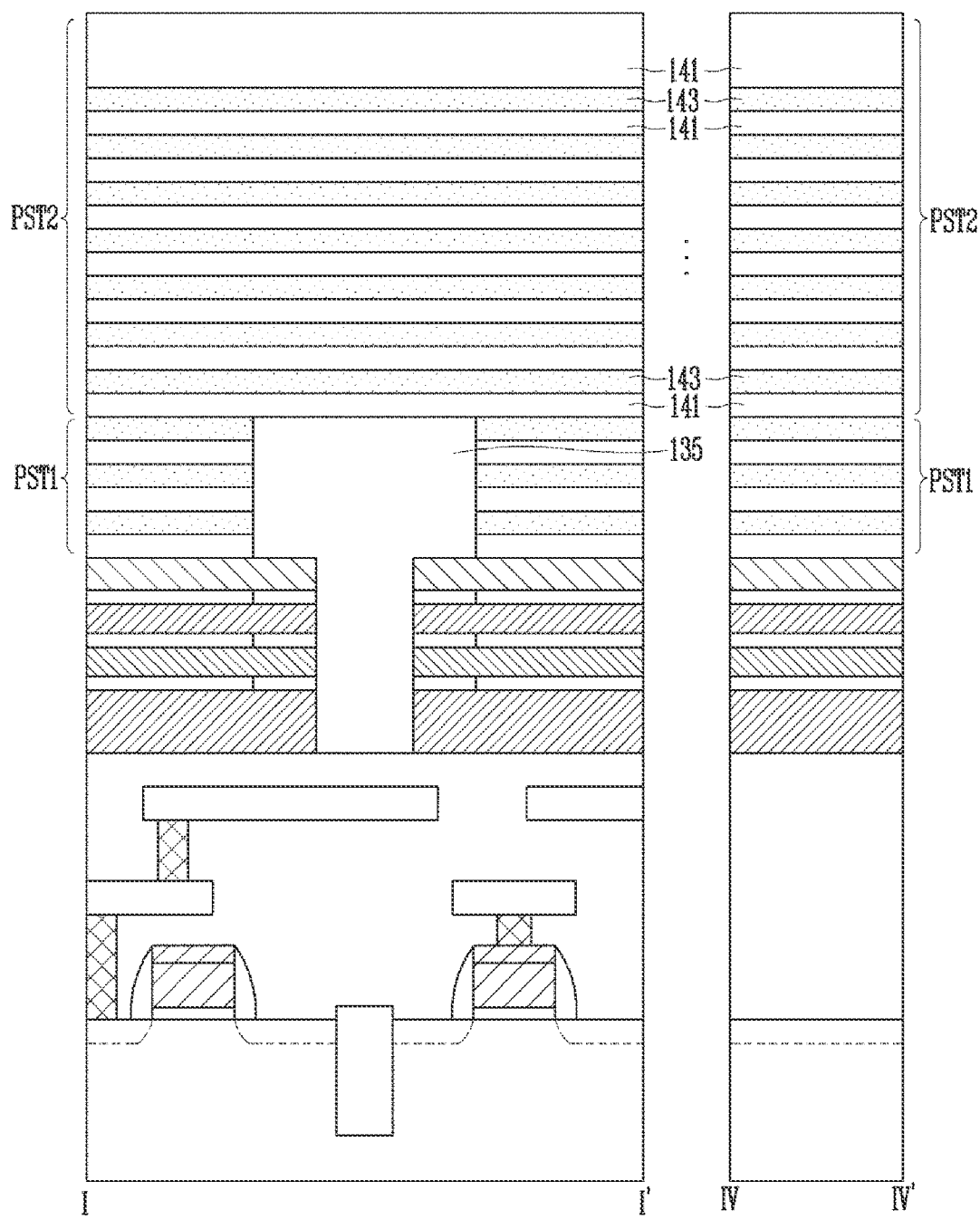

Referring to FIG. 8F, a second stack structure PST2 may be formed by alternately stacking third material layers 141 and fourth material layers 143 on the insulating pattern 135 and the first stack structure PST1.

The third material layers 141 may include the same material as the first material layers 121 described with reference to FIG. 8A and the fourth material layers 143 may include the same material as the second material layers 123 described with reference to FIG. 8A. For example, the third material layers 141 may include oxide layers such as silicon oxide ($SiO_2$) layers and the fourth material layers 143 may include nitride layers such as silicon nitride (SiN) layers.

Figure 8G:
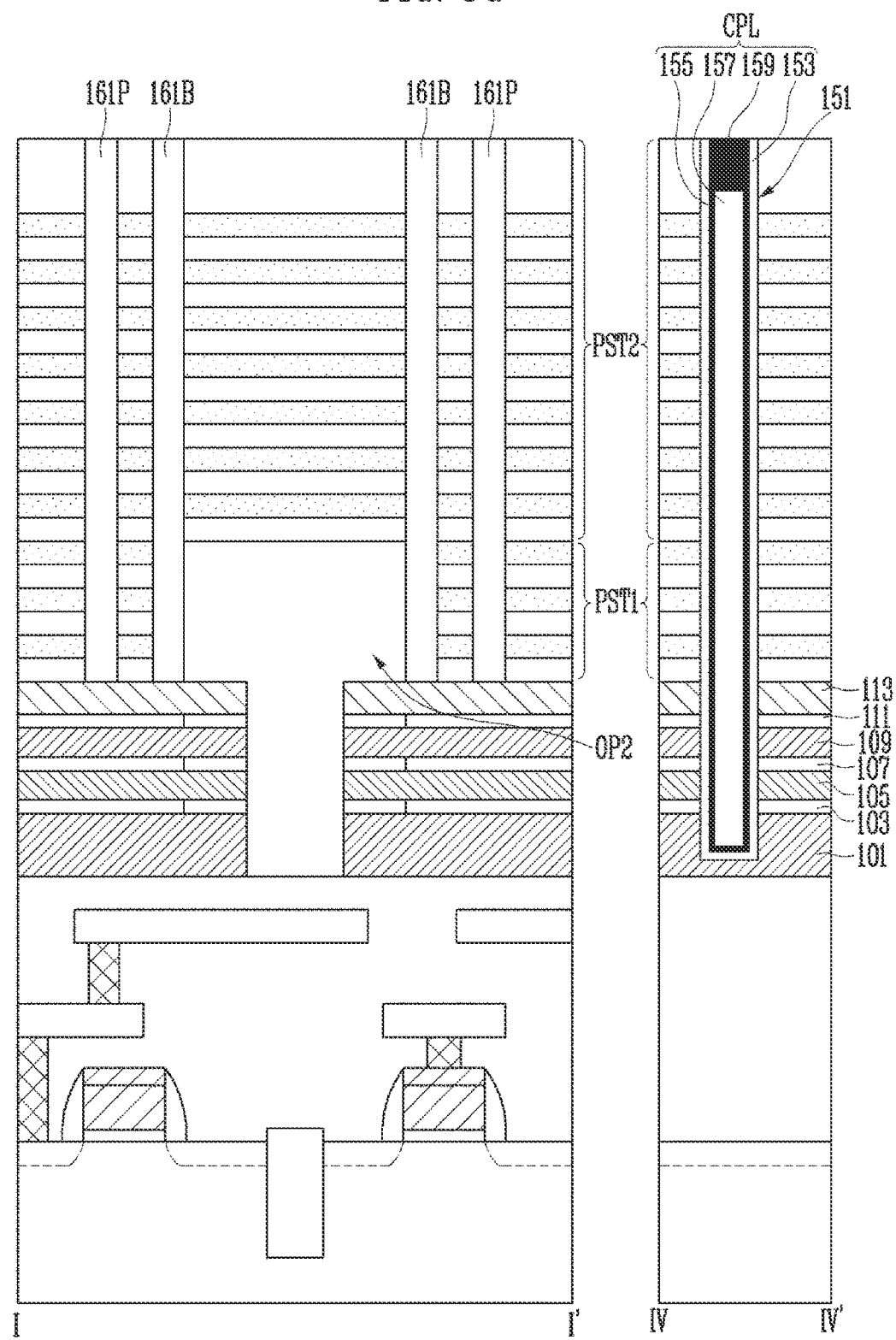

Referring to FIG. 8G, supporting structures 161P and 161B passing through the second stack structure PST2 and the first stack structure PST1 may be formed. In addition, the channel pillar CPL passing through the second stack structure PST2 and the first stack structure PST1 may be formed. The channel pillar CPL may further pass through the etch stop layer 113, the insulating layer 111, the second doped semiconductor layer 109, the second protective layer 107, the source sacrificial layer 105, and the first protective layer 103 to extend into the first doped semiconductor layer 101.

As described with reference to FIG. 2A, the supporting structures 161P and 161B may pass through the first stack structure PST1 adjacent to the second penetrating portion OP2, and may extend to pass through the second stack structure PST2. The supporting structures 161P and 161B may include the insulating pillars 161P and the insulating bars 161B as described with reference to FIG. 2A. In other examples, the supporting structures may include first insulating pillars and second insulating pillars as described with reference to FIG. 6. In other examples, the supporting structures may include dummy channel pillars as described with reference to FIG. 7. When the supporting structures consist of the dummy channel pillars, the dummy channel pillars may be simultaneously formed with the channel pillars CPL.

Each of the channel pillars CPL may be formed in a channel hole 151 passing through the first stack structure PST1 and the second stack structure PST2. The channel hole 151 may further pass through the etch stop layer 113, the insulating layer 111, the second doped semiconductor layer 109, the second protective layer 107, the source sacrificial layer 105, and the first protective layer 103 to extend into the first doped semiconductor layer 101. Forming the channel pillars CPL may include etching for forming the channel hole 151, forming a multilayer 153 on a surface of the channel hole 151, and forming a channel layer 155 on the multilayer 153.

The multilayer 153 may include a blocking insulating layer, a data storage layer, and a tunnel insulating layer as described above with reference to FIG. 5B. The channel layer 155 may include a semiconductor layer. The channel layer 155 may completely fill a central region of the channel hole 151. Alternatively, the channel layer 155 may be conformally formed on the multilayer 153 and the central region of the channel hole 151 might not be completely filled with the channel layer 155. A core insulating layer 157 and a capping conductive pattern 159 which fill the central region of the channel hole 151 may be formed on the channel layer 155. The capping conductive pattern 159 may fill the central region of the channel hole 151 on the core insulating layer 157.

Figure 8H:
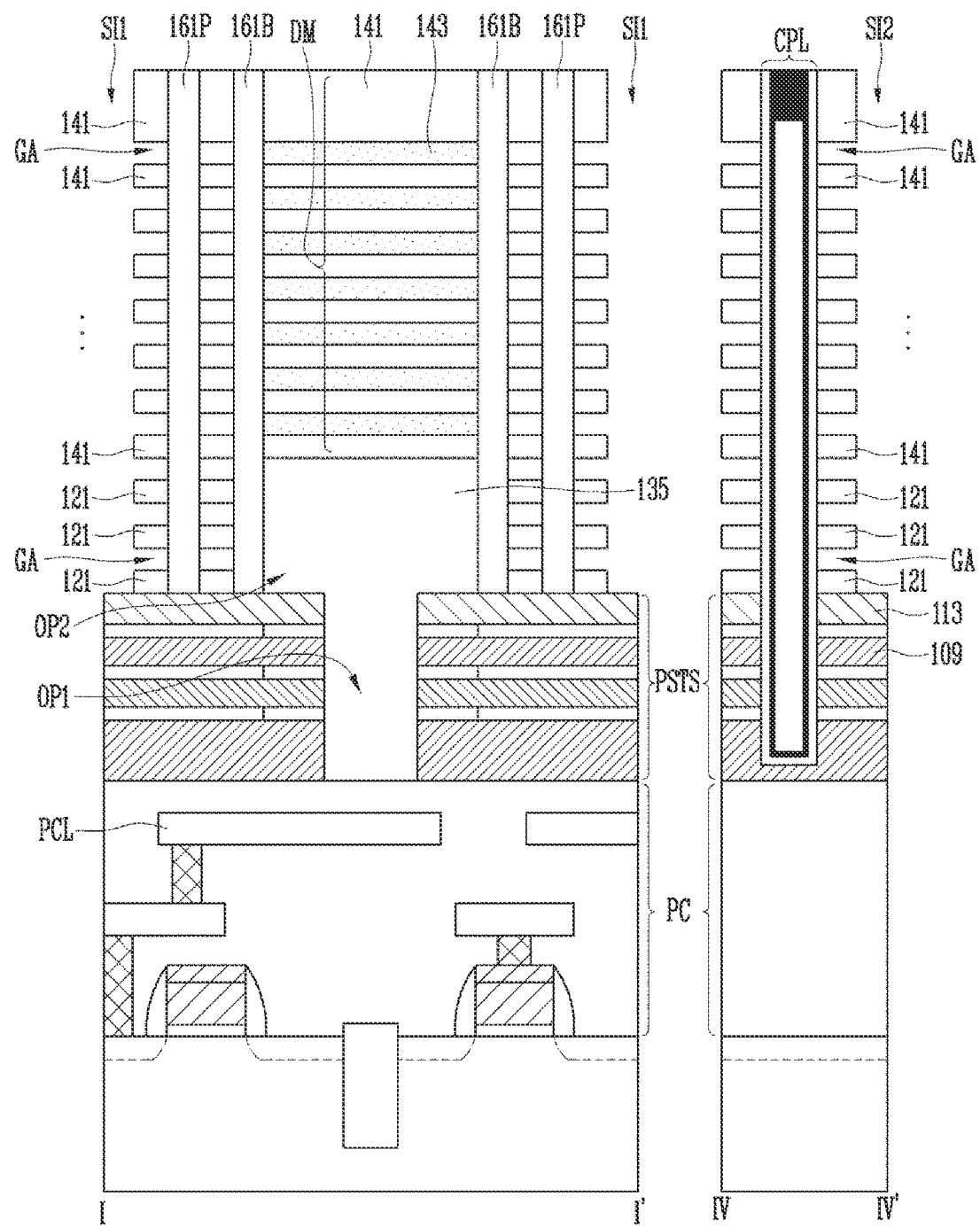

Referring to FIG. 8H, the first slits SI1 and the second slit SI2 which pass through the first stack structure PST1 and the second stack structure PST2 as shown in FIG. 8G may be formed. Layouts of the first slits SI1 and the second slit SI2 may be the same as described with reference to FIG. 2A.

As described with reference to FIG. 2A, since the second slit SI2 is coupled to the second penetrating portion OP2, the first stack structure PST1 shown in FIG. 8G may be divided into sub-stack structures by a connection structure of the second slit SI2 and the second penetrating portion OP2. According to an embodiment, the first stack structure PST1 may be divided into sub-stack structures by using a single mask process for forming a first penetrating portion in the source stack structure PSTS and a single mask process for forming the first slits SI1 and the second slit SI2. Therefore, according to the embodiments, since the first stack structure PST1 may be divided into more patterns than those of the second stack structure PST2 without adding a separate mask process, the manufacturing process of a semiconductor device may be simplified.

The first slits SI1 and the second slit SI2 might not overlap the first penetrating portion OP1 as described with reference to FIG. 2A. Thereby, since the entirety of each of the first slits SI1 and the second slit SI2 overlaps the source stack structure PSTS, the source stack structure PSTS may serve as an etch stop layer when an etching process for forming the first slits SI1 and the second slit SI2 is performed. In particular, the etch stop layer 113 or the second doped semiconductor layer 109 of the source stack structure PSTS may serve as an etch stop layer. Thereby, a phenomenon in which the peripheral circuit structure PC including the peripheral circuit wire PCL is damaged due to the influence of an etching process of the first slits SI1 and the second slit SI2 which have a great depth may be prevented.

Subsequently, the second material layers 123 of the first stack structure PST1 and the fourth material layers 143 of the second stack structure PST2 shown in FIG. 8G may be selectively removed through the first slits SI1 and the second slit SI2. Regions from which the second material layers and the fourth material layers are removed may be defined as gate regions GA. The gate regions GA may expose the channel pillars CPL.

An etching process for forming the gate regions GA may be controlled such that the fourth material layers 143 of the second stack structure PST2 which overlap the first penetrating portion OP1 remain as dummy layers. The fourth material layers 143 which remain as the dummy layers may constitute the dummy stack structure DM described with reference to FIG. 2B.

The supporting structures 161P and 161B may support the first material layers 121 and the third material layers 141 to remain without collapsing even when the gate regions GA are opened. The supporting structures 161P and 161B may block inflow of an etching material flowing in from the first slits SI1 towards a region overlapping the first penetrating portion OP1 during the etching process for opening the gate regions GA.

The above-described supporting structures 161P and 161B may have various forms as shown in FIGS. 2A, 6, and 7 and support the first material layers 121 and the third material layers 141. In addition, the supporting structures 161P and 161B may block the inflow of the etching material towards the region overlapping the first penetrating portion OP1.

Figure 8I:
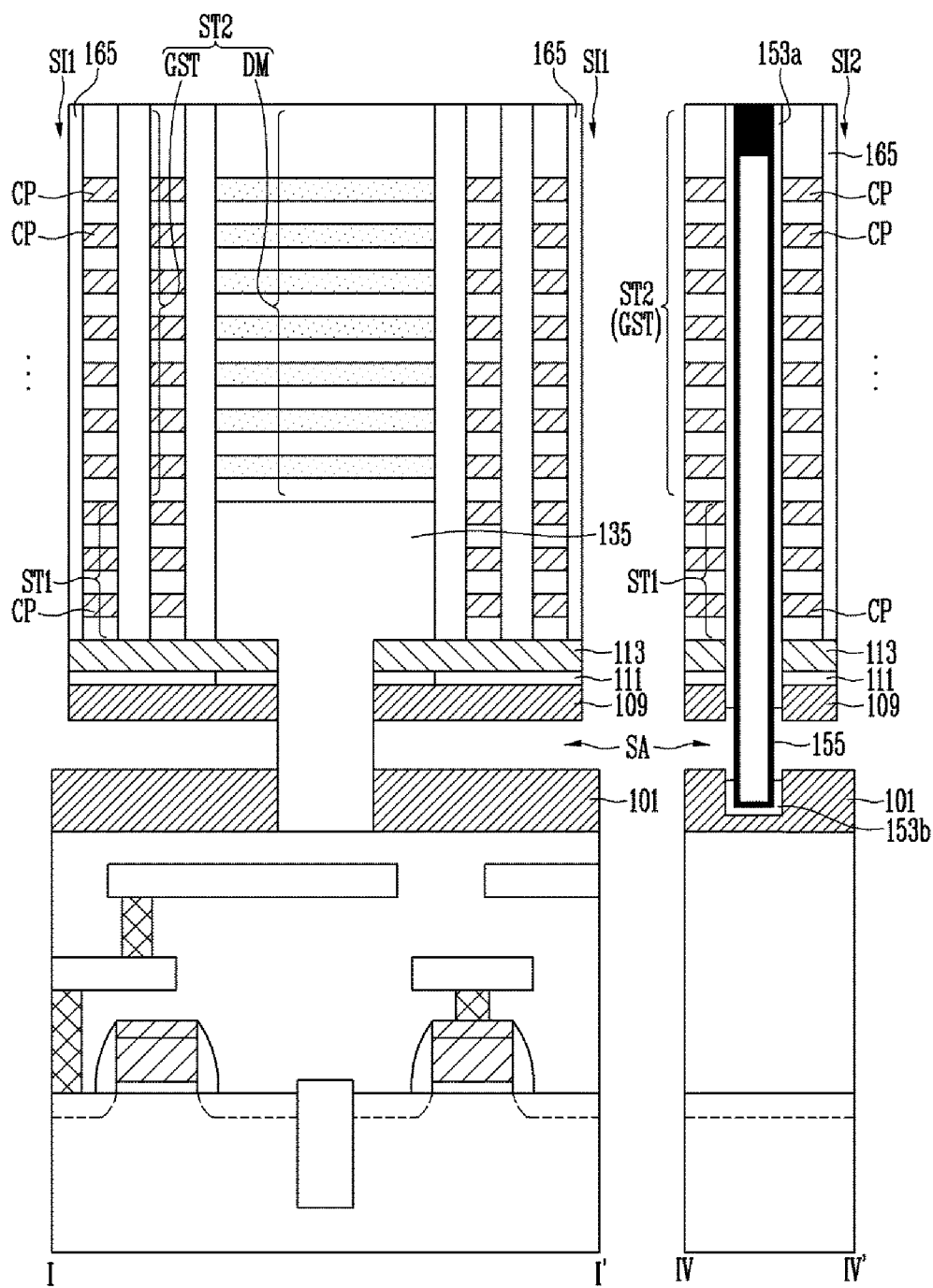

Referring to FIG. 8I, the gate regions GA shown in FIG. 8H may be filled with the conductive patterns CP. Thereby, as described with reference to FIG. 2B, the first stack structure ST1 including the conductive patterns CP and the second stack structure ST2 including the gate stack structure GST and the dummy stack structure DM may be formed.

Forming the conductive patterns CP may include forming a conductive material to fill the gate regions GA and removing a portion of the conductive material in the first and second slits SI1 and SI2 to divide the conductive material into the conductive patterns CP.

Each of the conductive patterns CP may include at least one of a doped silicon layer, a metal silicide layer, and a metal layer. A low-resistance metal such as Tungsten may be used for low-resistance wiring for each of the conductive patterns CP. Each of the conductive patterns CP may further include a barrier layer such as a titanium nitride layer, a tungsten nitride layer, and a tantalum nitride layer.

Subsequently, a sidewall insulating layer 165 may be formed on a sidewall of each of the first and second slits SI1 and SI2. Thereafter, a source sacrificial layer may be exposed by etching the etch stop layer 113, the insulating layer 111, and the second doped semiconductor layer 109 which are exposed through the first and second slits SI1 and SI2. Thereafter, the exposed source sacrificial layer may be removed. A region from which the source sacrificial layer is removed may be defined as a source region SA.

Subsequently, the multilayer exposed through the source region SA may be etched to be divided into a first multilayer pattern 153a and a second multilayer pattern 153b. A portion of the sidewall of the channel layer 155 may be exposed between the first multilayer pattern 153a and the second multilayer pattern 153b. The first and second protective layers may be removed during a process for forming the source region SA and a process for etching the multilayer. Thereby, a bottom surface of the second doped semiconductor layer 109 and a top surface of the first doped semiconductor layer 101 which face the source region SA may be exposed.

Figure 8J:
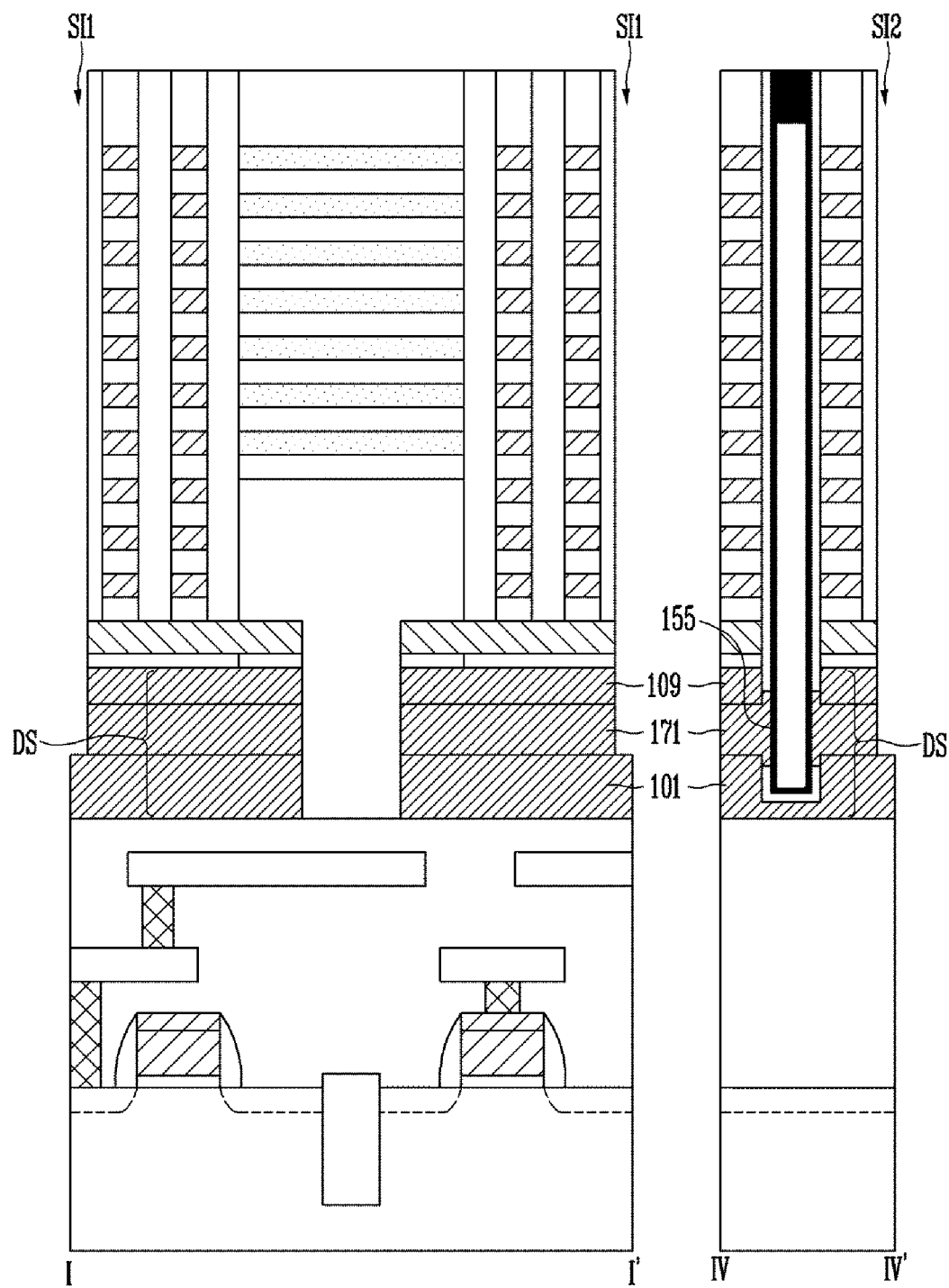

Referring to FIG. 8J, a third doped semiconductor layer 171 may be formed in the source region SA shown in FIG. 8I. The third doped semiconductor layer 171 may contact the channel layer 155, the first doped semiconductor layer 101, and the second doped semiconductor layer 109. The third doped semiconductor layer 171 may be formed by a chemical vapor deposition method or a growth method using the channel layer 155, the first doped semiconductor layer 101, and the second doped semiconductor layer 109 as seed layers. The first doped semiconductor layer 101, the second doped semiconductor layer 109, and the third doped semiconductor layer 171 may form the doped semiconductor structure DS as described with reference to FIG. 2B.

Figure 8K:
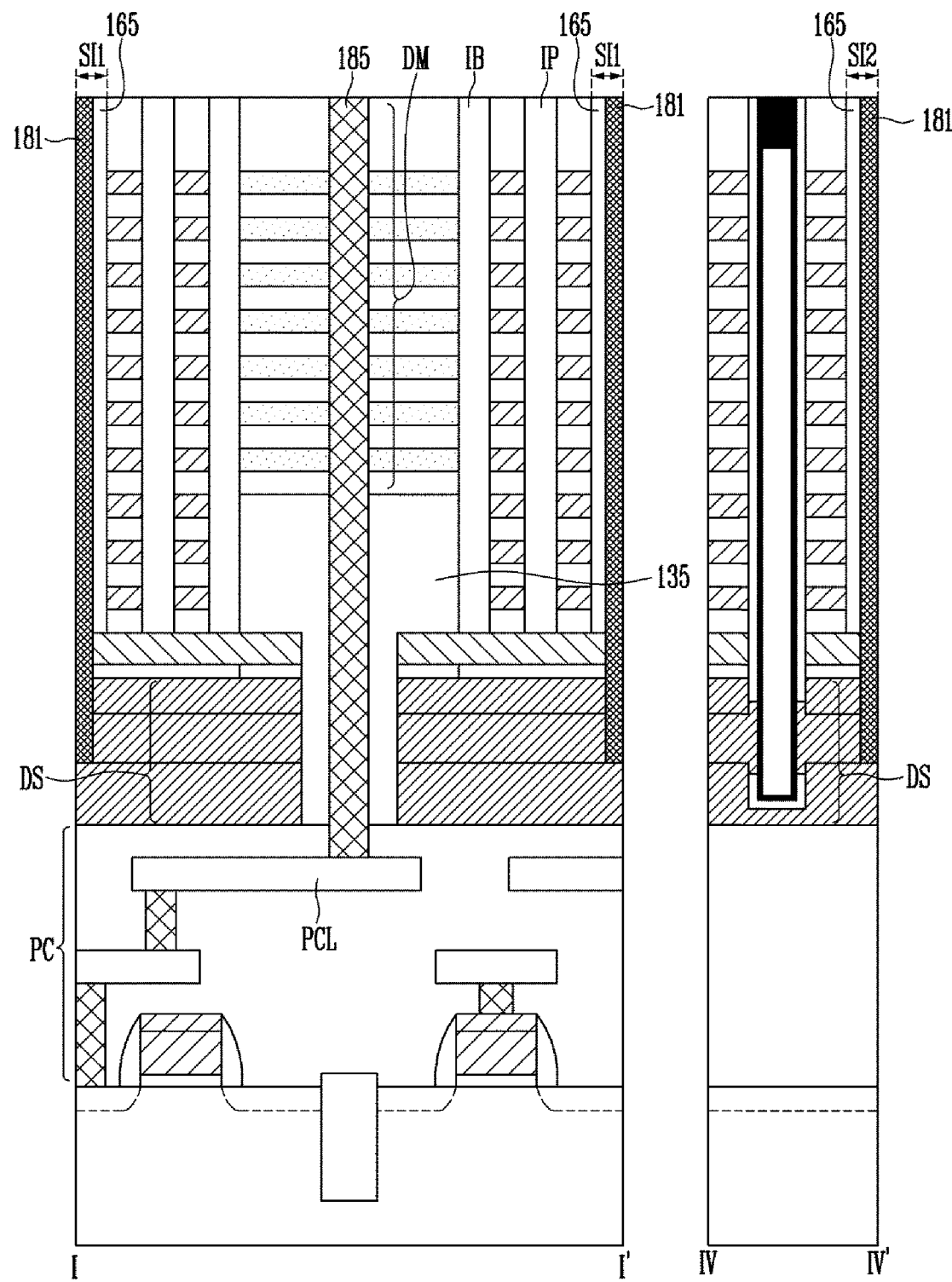

Referring to FIG. 8K, a source contact structure 181 filling each of the first slits SI1 and the second slit SI2 may be formed. The source contact structure 181 may be formed on the sidewall insulating layer 165 and contact the doped semiconductor structure DS.

Thereafter, a peripheral contact plug 185 coupled to the peripheral circuit wire PCL of the peripheral circuit structure PC may be formed. The peripheral contact plug 185 may extend to pass through the dummy stack structure DM on the insulating pattern 135 and the insulating pattern 135 and to be coupled to the peripheral circuit wire PCL. The dummy stack structure DM may be a portion of the second stack structure and have a stacked structure of the interlayer insulating layers and the sacrificial insulating layers. Thereby, an etching process for defining a region where the peripheral contact plug 185 is disposed may be performed targeting the insulating layers without blocking the conductive material or the semiconductor layer.

According to an embodiment, the first stack structure penetrated by the second penetrating portion may be disposed on the source structure penetrated by the first penetrating portion, and the second penetrating portion may be formed using a process for forming the first penetrating portion by having the second penetrating portion overlap the first penetrating portion. Thereby, the manufacturing process of the semiconductor device in accordance with the embodiments of the present disclosure may be simplified.

Figure 9:
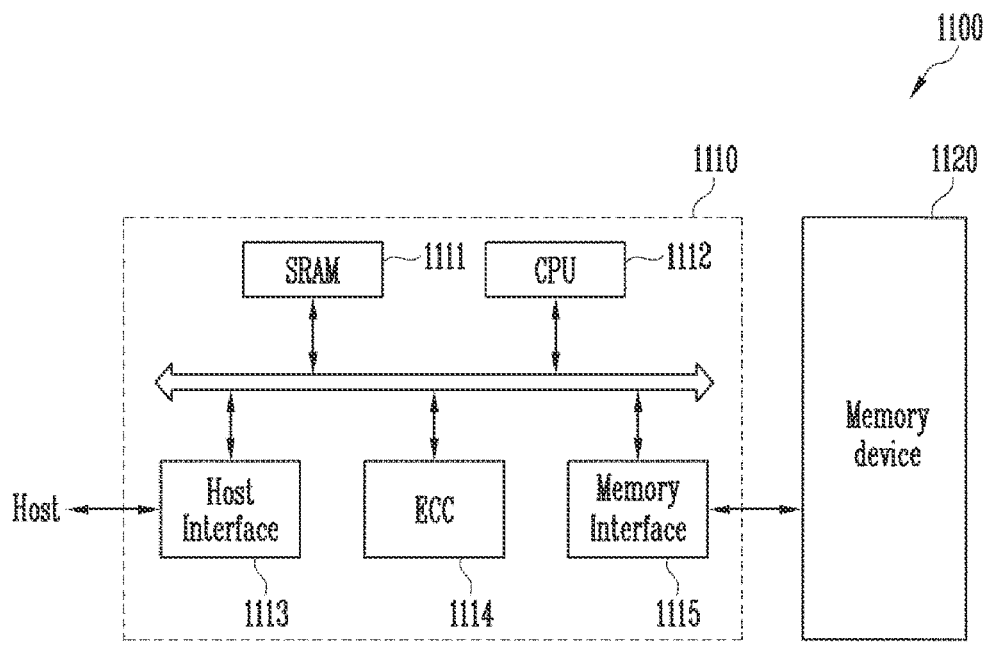
FIG. 9 is a block diagram illustrating the configuration of a memory system according to an embodiment.

FIG. 9 is a block diagram illustrating the configuration of a memory system 1100 according to an embodiment.

Referring to FIG. 9, the memory system 1100 according to an embodiment may include a memory device 1120 and a memory controller 1110.

The memory device 1120 may be a multi-chip package formed of a plurality of flash memory chips.

The memory controller 1110 may be configured to control the memory device 1120 and include a Static Random Access Memory (SRAM) 1111, a CPU 1112, a host interface 1113, an Error Correction Code (ECC) 1114, and a memory interface 1115. The SRAM 1111 may serve as an operation memory of the CPU 1112, the CPU 1112 may perform overall control operations for data exchange of the memory controller 1110, and the host interface 1113 may include a data exchange protocol for a host connected with the memory system 1100. In addition, the ECC 1114 may detect and correct errors included in the data read from the memory device 1120, and the memory interface 1115 may perform interfacing with the memory device 1120. In addition, the memory controller 1110 may further include a read only memory (ROM) for storing code data for interfacing with the host.

The above-described memory system 1100 may be a memory card or a Solid State Disk (SSD) equipped with the memory device 1120 and the memory controller 1110. For example, when the memory system 1100 is an SSD, the memory controller 1110 may communicate with an external device (e.g., a host) through one of various interface protocols including a Universal Serial Bus (USB), a MultiMedia Card (MMC), Peripheral Component Interconnection-Express (PCI-E), Serial Advanced Technology Attachment (SATA), Parallel Advanced Technology Attachment (PATA), a Small Computer Small Interface (SCSI), an Enhanced Small Disk Interface (ESDI), and Integrated Drive Electronics (IDE).

Figure 10:
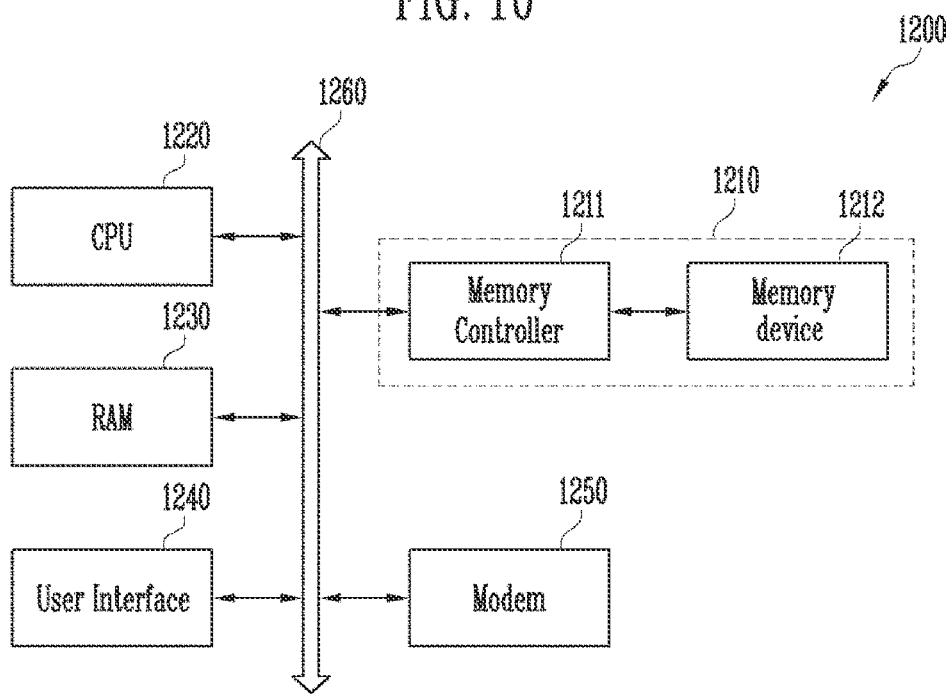
FIG. 10 is a block diagram illustrating the configuration of a computing system according to an embodiment.

FIG. 10 is a block diagram illustrating the configuration of a computing system 1200 according to an embodiment.

Referring to FIG. 10, the computing system 1200 according to an embodiment may include a CPU 1220, a Random Access Memory (RAM) 1230, a user interface 1240, a modem 1250, and a memory system 1210 which are electrically coupled to a system bus 1260. In addition, when the computing system 1200 is a mobile device, a battery for supplying an operating voltage to the computing system 1200 may be further included, and an application chipset, a camera image processor (CIS), a mobile DRAM, and the like may be further included.

The memory system 1210 may include a memory device 1212 and a memory controller 1211.

The above-discussed embodiments aim to help those with ordinary knowledge in this art more clearly understand the present disclosure rather than aiming to limit the bounds of the present disclosure. It should be understood that many variations and modifications of the basic concepts described herein will still fall within the spirit and scope of the present disclosure as defined in the accompanying claims and equivalents thereof.

So far as not being differently defined, all terms used herein including technical or scientific terminologies have meanings that they are commonly understood by those skilled in the art to which the present disclosure pertains. So far as not being clearly defined in this application, terms should not be understood in an ideally or excessively formal way.

What is claimed is:

1. A method of manufacturing a semiconductor device, the method comprising:
   forming a first stack structure by alternately stacking first and second material layers on a source stack structure;
   forming a first penetrating portion passing through the first stack structure and the source stack structure; and
   forming a second penetrating portion exposing a top surface of the source stack structure by etching the first stack structure from a side portion of the first penetrating portion,
   wherein the top surface of the source stack structure is formed of a material different from the first and second material layers, and
   wherein the source stack structure includes at least one doped semiconductor layer.

2. A method of manufacturing a semiconductor device, the method comprising:
   forming a first stack structure by alternately stacking first and second material layers on a source stack structure;

forming a first penetrating portion passing through the first stack structure and the source stack structure; and forming a second penetrating portion exposing a top surface of the source stack structure by etching the first stack structure from a side portion of the first penetrating portion, wherein the forming of the second penetrating portion comprises:

forming first grooves by selectively etching the second material layers exposed through a side portion of the first penetrating portion; and removing the first grooves by selectively etching the first material layers exposed through the side portion of the first penetrating portion.

3. A method of manufacturing a semiconductor device, the method comprising:

forming a first stack structure by alternately stacking first and second material layers on a source stack structure;

forming a first penetrating portion passing through the first stack structure and the source stack structure;

forming a second penetrating portion exposing a top surface of the source stack structure by etching the first stack structure from a side portion of the first penetrating portion;

forming an insulating pattern filling the first and second penetrating portions; and forming a second stack structure by alternately stacking third and fourth material layers on the insulating pattern and the first stack structure.

4. The method of claim 3, further comprising forming supporting structures passing through the first stack structure adjacent to the second penetrating portion and extending to pass through the second stack structure.

5. The method of claim 3, further comprising forming channel pillars passing through the first stack structure and the second stack structure and extending into the source stack structure.

6. The method of claim 5, further comprising forming a slit traversing a space between the channel pillars to pass through the first stack structure and the second stack structure, and crossing one side of the second penetrating portion.

7. The method of claim 6, wherein the slit does not overlap the first penetrating portion.

8. The method of claim 6, wherein an end portion of the slit facing the first penetrating portion overlaps the source stack structure exposed by the second penetrating portion.

9. The method of claim 5, further comprising forming first slits and a second slit passing through the first stack structure and the second stack structure, wherein the first slits divide each of the first stack structure and the second stack structure into memory blocks, and wherein the second slit traverses a space between the channel pillars to pass through each of the memory blocks and crosses a portion of the second penetrating portion.

10. The method of claim 9, further comprising:

forming gate regions exposing the channel pillars by removing the second material layers of the first stack structure and the fourth material layers of the second stack structure through the first slits and the second slit; and filling the gate regions with conductive patterns.

11. The method of claim 10, wherein the forming of the gate regions is controlled such that the fourth material layers overlapping the first penetrating portion remain as dummy layers.

12. The method of claim 3, wherein each of the first material layers and the third material layers includes a silicon oxide layer, and wherein each of the second material layers and the fourth material layers includes a silicon nitride layer.

13. The method of claim 3, further comprising forming a contact plug passing through the insulating pattern and the second stack structure on the insulating pattern.

14. The method of claim 13, wherein the contact plug is coupled to a peripheral circuit structure disposed under the source stack structure.

* * * * *